(12) United States Patent
Suzuki et al.

(10) Patent No.: US 6,781,846 B1
(45) Date of Patent: Aug. 24, 2004

(54) IC CARD AND IC CARD COOLING TRAY

(75) Inventors: Masumi Suzuki, Kawasaki (JP); Minoru Hirano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/482,518

(22) Filed: Jan. 14, 2000

Related U.S. Application Data

(62) Division of application No. 08/681,452, filed on Jul. 23, 1996, now Pat. No. 6,031,718.

(30) Foreign Application Priority Data

Jan. 17, 1996 (JP) .............................................. 8-005551

(51) Int. Cl.⁷ ................................................. H05K 1/14
(52) U.S. Cl. ....................................... 361/737; 361/395
(58) Field of Search ................................ 361/695, 737, 361/687–697, 715, 716, 724–733, 803

(56) References Cited

U.S. PATENT DOCUMENTS

| | | | |
|---|---|---|---|
| 4,858,070 A | * 8/1989 | Buron et al. ................. 361/384 |
| 4,955,131 A | 9/1990 | Chall, Jr. | |
| 5,375,037 A | * 12/1994 | Le Roux ..................... 361/684 |
| 5,437,041 A | 7/1995 | Wakabayashi | |
| 5,477,426 A | * 12/1995 | Bethurum .................... 361/737 |
| 5,548,483 A | 8/1996 | Feldman | |
| 5,608,607 A | * 3/1997 | Dittmer ...................... 361/686 |
| 5,659,459 A | 8/1997 | Wakabayashi | |
| 5,680,294 A | * 10/1997 | Stora et al. ................. 361/695 |
| 5,725,622 A | * 3/1998 | Whitson et al. ........... 55/385.4 |
| 5,745,041 A | 4/1998 | Moss | |

* cited by examiner

Primary Examiner—David Martin
Assistant Examiner—Thanh S. Phan
(74) Attorney, Agent, or Firm—Staas & Halsey LLP

(57) ABSTRACT

An IC card adapted to be removably inserted into a slot of an IC card mountable device, including a card housing formed like a substantially rectangular card with an inside space defined therein, the card housing having a plurality of openings through a wall of the card housing; a printed wiring board accommodated in the card housing; and a plurality of electronic components mounted on the printed wiring board.

3 Claims, 34 Drawing Sheets

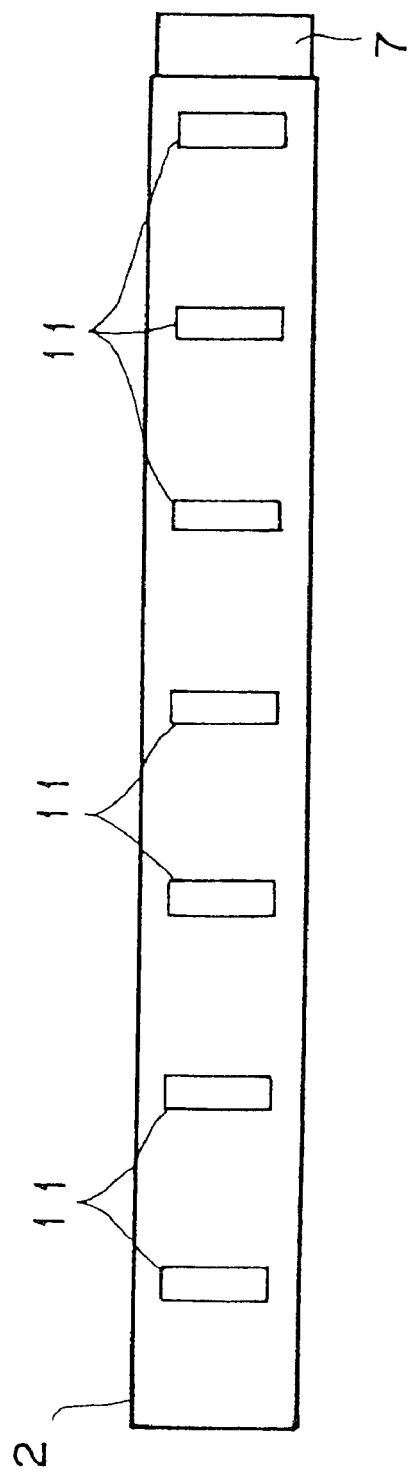

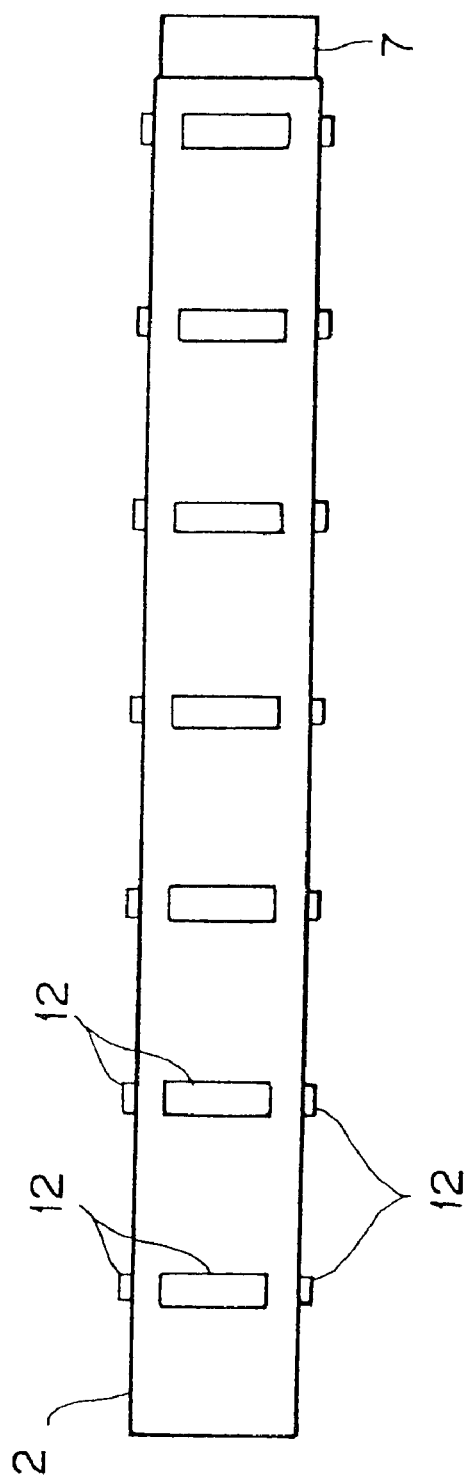

IC CARD AND IC CARD COOLING TRAY

This application is a divisional of application Ser. No. 08/681,452, filed Jul. 23, 1996, now allowed now U.S. Pat. No. 6,031,718.

BACKGROUND OF THE INVENTION

1. Field of the Invention

The present invention relates to a technique for cooling an IC card inserted in a slot of an IC card mountable device such as a portable personal computer.

2. Description of the Related Art

In a portable computer such as a notebook personal computer, it is necessary to meet both a requirement of high functionality and multiple functionality and another requirement of size reduction and weight reduction, these requirements being contrary to each other. To meet these requirements, an IC card conforming with the standard by PCMCIA (Personal Computer Memory Card International Association) or the like is removably inserted into a slot of an IC card mountable device such as a portable personal computer. Such an IC card is dedicated to each of various additional functions (e.g., extension memory, communication modem, hard disk unit), and it is fully inserted into the slot of the IC card mountable device for use by an user as required. The IC card is formed by covering a printed wiring board on which electronic components such as an LSI are mounted, with resin by resin molding to form a cardlike configuration, or by accommodating the printed wiring board in a flat boxlike metal housing.

In recent years, high integration in such an IC card has been developed to cause an increase in heating value. Further, it has also been considered to mount a CPU having a high heating value in the IC card. However, no specific measures for cooling the IC card have conventionally been made, so that there is a problem that the IC card may malfunction or fail because of a temperature rise by its heating. Accordingly, it is difficult to expect higher integration in the IC card, and electronic components having high heating values, such as an CPU, cannot be mounted in the IC card. Further, in addition to the heat from the IC card itself, the heat from any heating parts mounted in the IC card mountable device other than the IC card sometimes has an influence upon the temperature rise of the IC card, causing a similar problem.

SUMMARY OF THE INVENTION

It is therefore an object of the present invention to provide a technique for cooling an IC card with a high efficiency to allow higher integration in the IC card and allow mounting of electronic components having high heating values, such as a CPU.

In accordance with an aspect of the present invention, there is provided an IC card adapted to be removably inserted into a slot of an IC card mountable device, comprising a card housing formed like a substantially rectangular card with an inside space defined therein, the card housing having a plurality of openings through a wall of the card housing; a printed wiring board accommodated in the card housing; and a plurality of electronic components mounted on the printed wiring board.

When the IC card is inserted into the slot of the IC card mountable device, the air inside the IC card mountable device flows from the openings into the card housing, and the air inside the card housing flows out from the openings together with the heat inside the card housing, thereby cooling the electronic components. The dimension of the card housing in a direction of insertion of the IC card into the slot may be set so that the card housing has a first portion present inside the slot and a second portion projecting outward from the slot in the condition where the IC card is inserted in the slot. Further, heating components of the electronic components may be located on a portion of the printed wiring board accommodated in the second portion of the card housing. Accordingly, the heat generated from the IC card (especially, from the heating components of the electronic components) can be radiated from the second portion of the card housing to the outside of the IC card mountable device, thereby improving the cooling efficiency.

In accordance with another aspect of the present invention, there is provided an IC card cooling tray adapted to be removably inserted into a slot of an IC card mountable device in a condition where an IC card is held on the cooling tray, comprising a tray body formed like a substantially rectangular thin plate so that the IC card is kept in close contact with the tray body; and a holding member formed integrally with the tray body, for removably holding the IC card. The tray body and the holding member may be formed of a material having a high heat conductivity, such as copper.

The IC card is held by the holding member in such a condition as to be kept in close contact with the tray body, thus being integrated with the IC card cooling tray. The assembly of the IC card and the IC card cooling tray is inserted into the slot of the IC card mountable device. The heat generated from the IC card is transferred to the IC card cooling tray formed of a material having a high heat conductivity, because the IC card is kept in close contact with the tray body, thereby cooling the IC card with a high efficiency. The dimension of the tray body in a direction of insertion of the IC card tray into the slot may be set so that the tray body has a first portion present in the slot and a second portion projecting outward from the slot in the condition where the cooling tray is inserted in the slot. Accordingly, the heat transferred from the IC card to the cooling tray can be radiated from the second portion of the tray body to the outside of the IC card mountable device, thereby improving the cooling efficiency.

The above and other objects, features and advantages of the present invention and the manner of realizing them will become more apparent, and the invention itself will best be understood from a study of the following description and appended claims with reference to the attached drawings showing some preferred embodiments of the invention.

DESCRIPTION OF THE DRAWINGS

FIG. 4 is a side view of an IC card according to a first preferred embodiment of the present invention;

FIG. 5 is a side view of an IC card according to a second preferred embodiment of the present invention;

DETAILED DESCRIPTION OF THE PREFERRED EMBODIMENTS

Basic Configuration of Preferred Embodiments

Figure 1A:
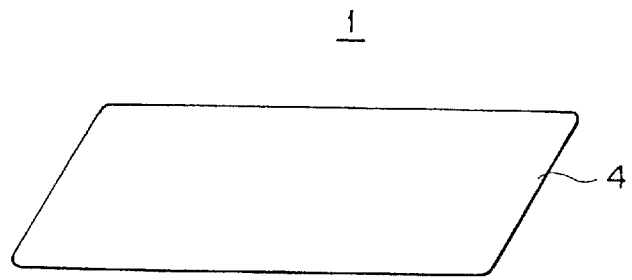
FIGS. 1A, 1B, 1C, and 1D are an exploded perspective view of an IC card, showing a basic configuration of some preferred embodiments of the present invention.
Figure 1B:
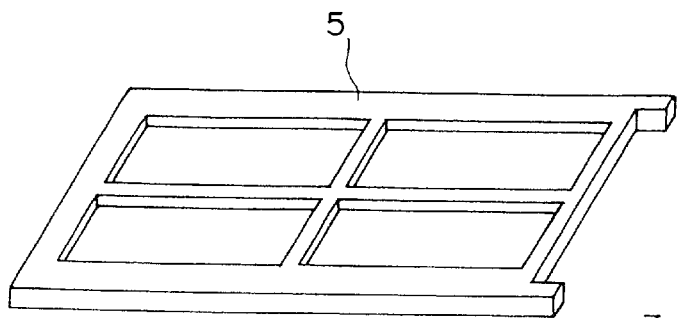
Figure 1C:
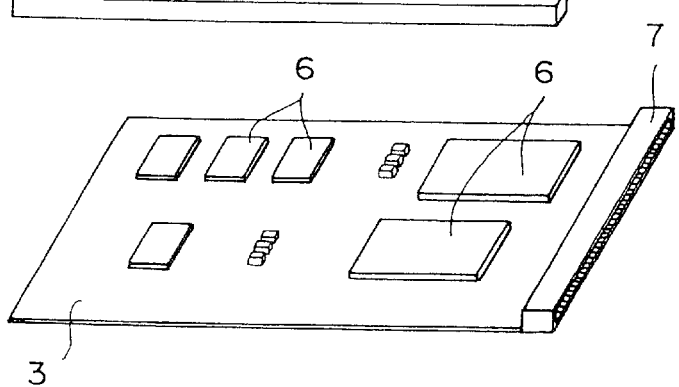
Figure 1D:
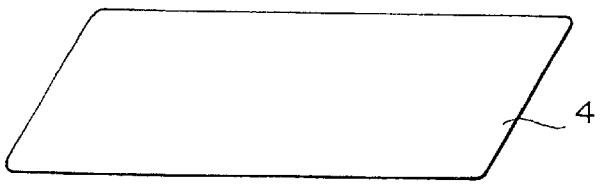
Figure 2:
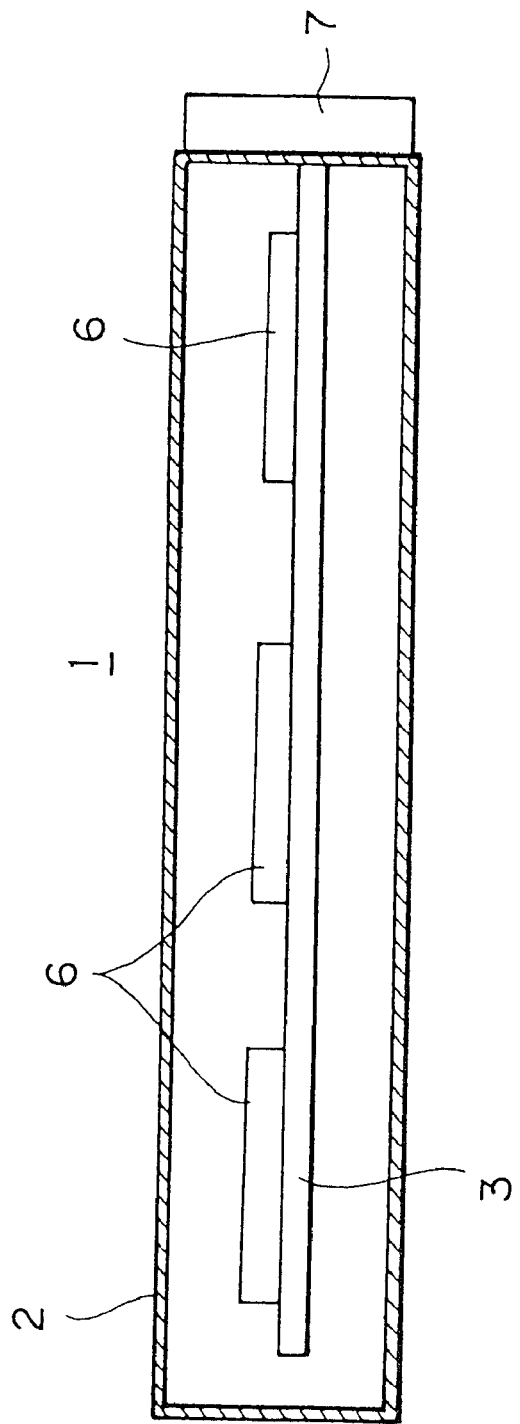
FIG. 2 is a sectional view of the IC card shown in FIG. 1.

The basic configuration of some preferred embodiments of the present invention will now be described with reference to FIGS. 1A, 1B, 1C, 1D, 2, 3A, and 3B. As shown in FIGS. 1A, 1B, 1C, 1D, and 2, an IC card 1 configured according to the standard by PCMCIA or the like is composed generally of a card housing 2 and a printed wiring board 3. The card housing 2 is formed like a substantially rectangular card with an inside space defined therein. The card housing 2 is composed of a pair of upper and lower covers 4 each formed from a thin plate and a frame 5. The upper and lower covers 4 are formed of a metal material having a high heat conductivity, such as copper (Cu) or a nonmetal material having a high heat conductivity, such as carbon fiber. The frame 5 is also formed of a material having a high heat conductivity.

The printed wiring board 3 is formed from an epoxy plate having a wiring layer and an insulating layer laminated together. A plurality of electronic components 6 including heating components (CPU chips, memory chips, etc.) are mounted on the printed wiring board 3. In the following description, the printed wiring board will be regarded as one formed from an epoxy plate unless otherwise specified. A first connector 7 is mounted on the front end of the printed wiring board 3 so as to extend along the front end. The first connector 7 may be mounted on the front end of the card housing 2. The printed wiring board 3 is integrated with the upper and lower covers 4 and the frame 5 so as to be interposed therebetween, thus being accommodated in the card housing 2.

Figure 3B:
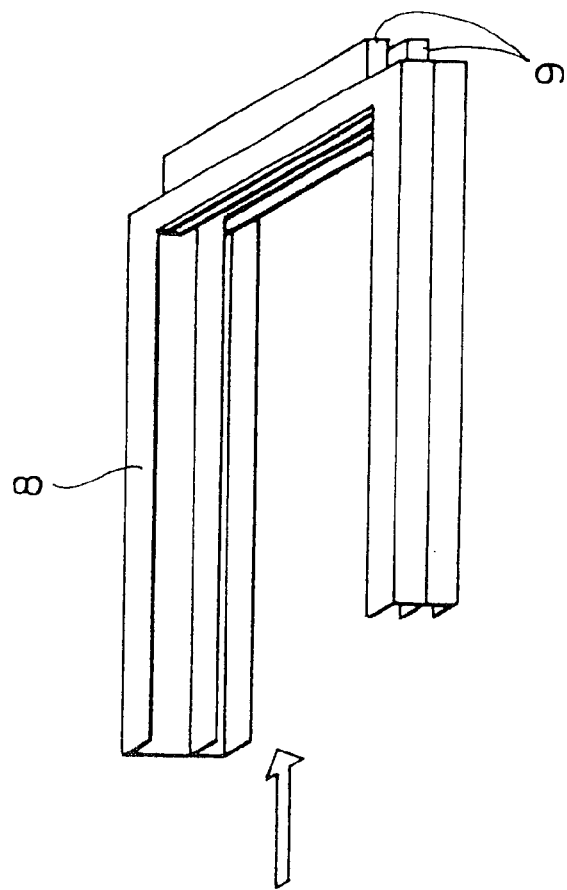
FIG. 3B is a perspective view of a socket defining a slot of an IC card mountable device into which the IC card is to be inserted.
Figure 3A:
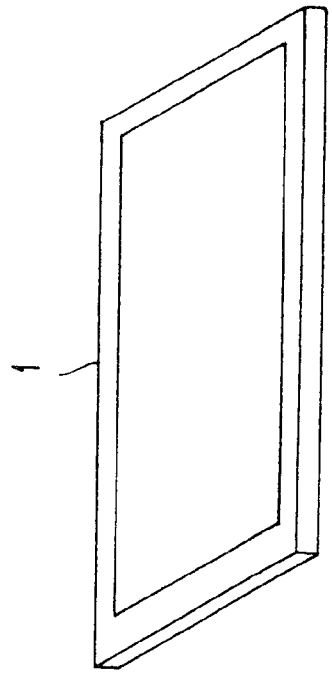
FIG. 3A is a perspective view of the IC card shown in FIG. 1.

The IC card 1 having such a configuration is designed to be mounted into an IC card mountable device (e.g., a notebook personal computer). The IC card mountable device has a slot into which the IC card 1 is to be inserted. As shown in FIGS. 3A and 3B, the slot is defined by a socket 8 having a pair of opposed guide portions for guiding the opposite side edges of the IC card 1 and a second connector 9 to be engaged with the first connector 7 of the IC card 1. Although not shown, the socket 8 is mounted in the IC card mountable device in such a manner that the card introducing side of the socket 8 (the side opposite to the second connector 9) is located at an opening formed through a wall of a housing of the IC card mountable device, and the side of the second connector 9 is located in the depth of the IC card mountable device.

While the socket 8 shown in FIG. 3B is of a type such that the IC card 1 and another similar IC card can be accommodated in a vertically stacked fashion, another type of socket capable of accommodating the IC card 1 only is also known. As mentioned above, the upper and lower covers 4 and the frame 5 constituting the card housing 2 are formed of a material having a high heat conductivity. Accordingly, heat generated from the electronic components 6 is radiated through the card housing 2 to the outside thereof with a high efficiency.

Various preferred embodiments of the present invention will now be described more specifically on the basis of the above-mentioned basic configuration.

First Preferred Embodiment

FIG. 4 shows an IC card according to a first preferred embodiment of the present invention. The card housing 2 of the IC card 1 is formed with a plurality of openings 11 arranged regularly, for making communication between the space inside of the card housing 2 and the space outside thereof. Accordingly, the outside air is allowed to pass through some of the openings 11 of the card housing 2 into the space inside of the card housing 2, and the inside air is allowed to pass through the other openings 11 of the card housing 2 to the space outside of the card housing 2 together with heat generated from the electronic components 6, thus radiating the heat inside of the card housing 2 with a high efficiency. The openings 11 may be formed through any side walls of the card housing 2 (side walls of the frame 5) other than the side wall on which the first connector 7 is mounted, and/or through the upper and lower walls of the card housing 2 (the upper and lower covers 4). The regular arrangement of the openings 11 is not essential, but the openings 11 may be formed concentrically at a portion of the card housing 2 corresponding to heating components of the electronic components 6.

Second Preferred Embodiment

FIG. 5 shows an IC card according to a second preferred embodiment of the present invention. A plurality of projecting members 12 are mounted on the outer surface of the card housing 2 of the IC card 1, and arranged regularly. Owing to the projecting members 12, the area of the outer surface of the card housing 2 exposed to the space outside of the card housing 2 is larger than that of the card housing 2 without the projecting members 12, thereby improving the radiation efficiency. The projecting members 12 may be mounted on any side surfaces of the card housing 2 (side surfaces of the frame 5) other than the side surface on which the first connector 7 is mounted, and/or on the upper and lower surfaces of the card housing 2 (the upper and lower covers 4). The projecting members 12 are members independent of the card housing 2, and they are integrated with the card housing 2 by bonding. Alternatively, the outer surface of the card housing 2 may be embossed or the like to form a plurality of projections and/or recesses, thereby obtaining a similar effect.

Third Preferred Embodiment

Figure 6:
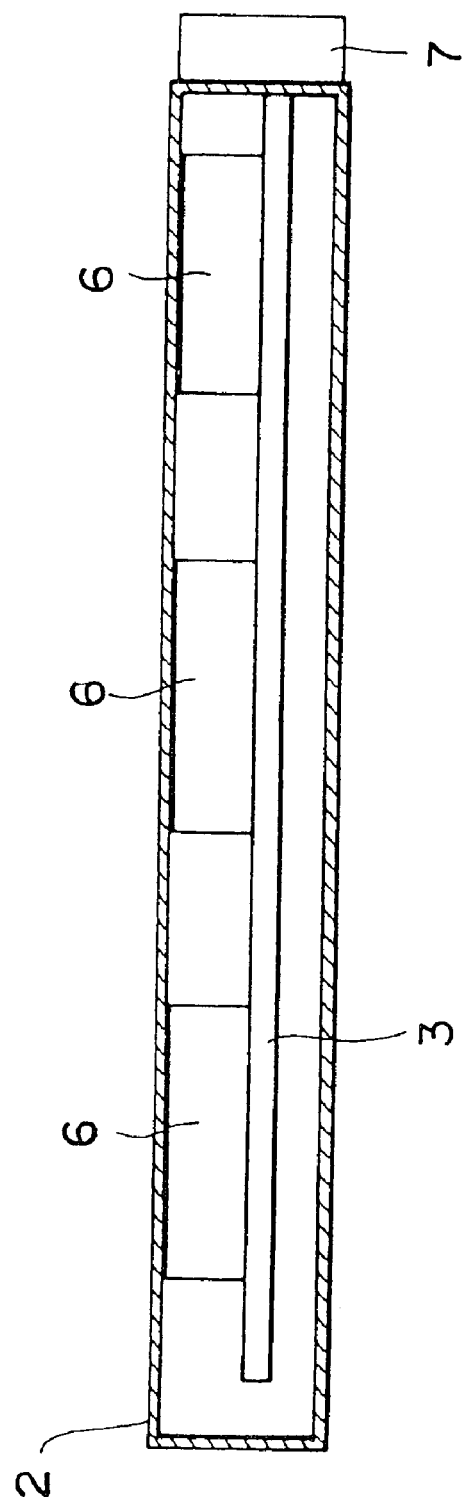
FIG. 6 is a sectional view of an IC card according to a third preferred embodiment of the present invention.

FIG. 6 shows an IC card according to a third preferred embodiment of the present invention. The electronic components 6 including heating components (e.g., LSI) mounted on the printed wiring board 3 accommodated in the card housing 2 are in close contact with the inner surface of the card housing 2 (the upper cover 4). Heat generated from the electronic components 6 is transferred from the upper surfaces of the electronic components 6 (the surfaces opposite to the mounted surfaces on the printed wiring board 3) directly to the upper cover 4 formed of a material having a high heat conductivity, thereby radiating the heat to the outside of the card housing 2 with a high efficiency.

Fourth Preferred Embodiment

Figure 7:
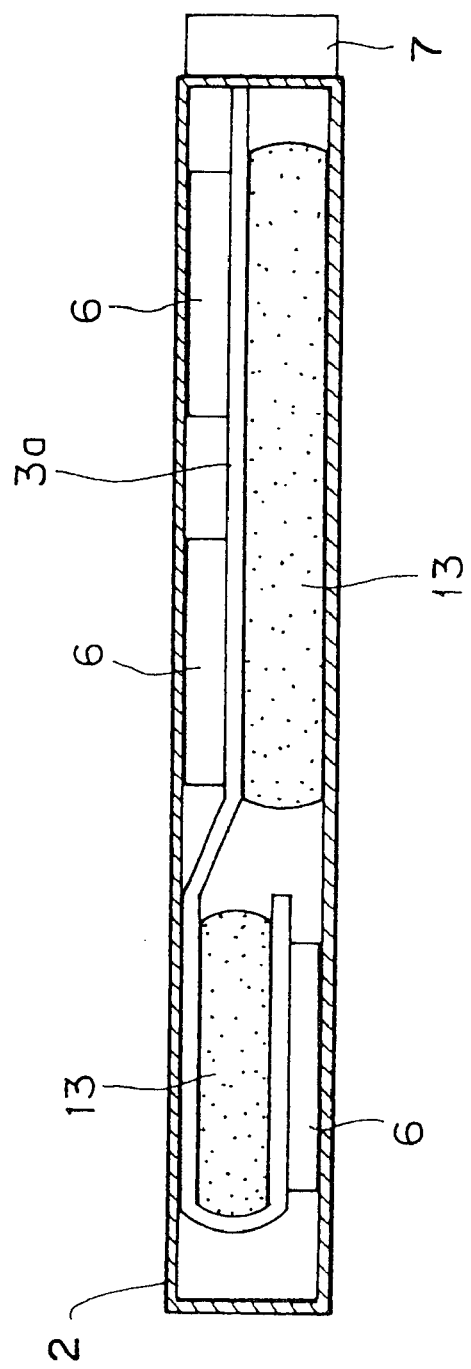
FIG. 7 is a sectional view of an IC card according to a fourth preferred embodiment of the present invention.

FIG. 7 shows an IC card according to a fourth preferred embodiment of the present invention. A sheetlike flexible printed wiring board 3a is used as the printed wiring board accommodated in the card housing 2. The electronic components 6 are mounted on one surface of the flexible printed wiring board 3a. The flexible printed wiring board 3a is bent in a substantially U-shaped form within the card housing 2. The electronic components 6 mounted on the flexible printed wiring board 3a are in close contact with the inner surface of the card housing 2. More specifically, the surfaces of the electronic components 6 (the surfaces opposite to the mounted surfaces on the flexible printed wiring board 3a) are in close contact with the inner surface of the card housing 2 (the upper and lower covers 4). Platelike elastic members 13 formed of rubber or the like are suitably located in the card housing 2 to improve the contact between the electronic components 6 and the card housing 2, thereby realizing a high radiation efficiency. The elastic members 13 may also be formed of a material having a high heat conductivity to thereby expect heat radiation therethrough.

Fifth Preferred Embodiment

Figure 8:
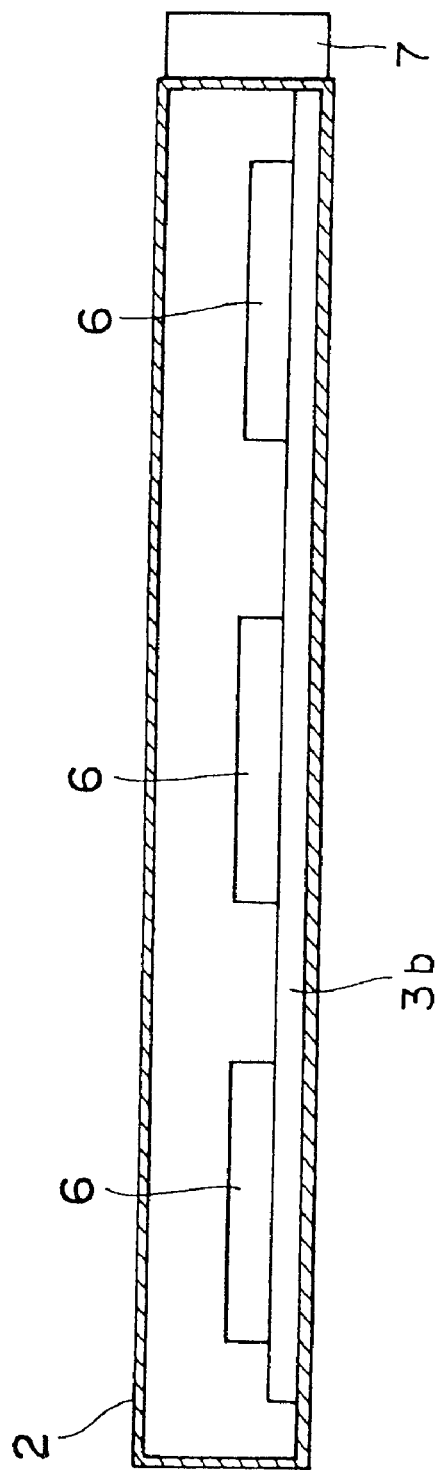
FIG. 8 is a sectional view of an IC card according to a fifth preferred embodiment of the present invention.

FIG. 8 shows an IC card according to a fifth preferred embodiment of the present invention. A metal wiring board (metal printed wiring board) 3b is used as the printed wiring board accommodated in the card housing 2. The metal wiring board 3b is composed of a metal plate, an insulating layer formed on one surface of the metal plate, and a wiring layer formed on the insulating layer. The electronic components 6 are mounted on the wiring layer of the metal wiring board 3b. The metal wiring board 3b is accommodated in the card housing 2 in the condition that the other surface of the metal plate is close contact with the inner surface of the card housing 2 (the lower cover 4). The metal plate of the metal wiring board 3b is formed of a metal material having a high heat conductivity, such as copper (Cu). Heat generated from the electronic components 6 is transferred through the metal plate to the card housing 2 with a high efficiency, thereby improving the radiation efficiency.

Sixth Preferred Embodiment

Figure 9:
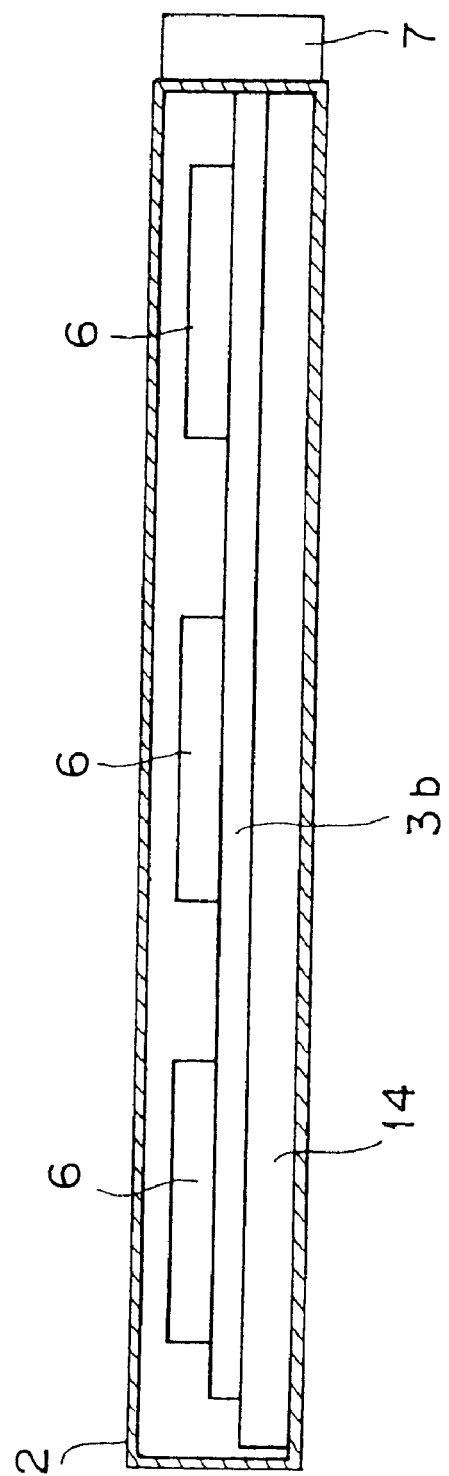
FIG. 9 is a sectional view of an IC card according to a sixth preferred embodiment of the present invention.

FIG. 9 shows an IC card according to a sixth preferred embodiment of the present invention. A metal wiring board (metal printed wiring board) 3b similar to that shown in FIG. 8 is used as the printed wiring board accommodated in the card housing 2. The electronic components 6 are mounted on the wiring layer of the metal wiring board 3b. The metal plate is formed of a metal material having a high heat conductivity, such as copper (Cu). A platelike metal block 14 formed of a metal material having a high heat conductivity, such as copper (Cu) is further accommodated in the card housing 2 in the condition that one surface of the metal block 14 is in close contact with the inner surface of the card housing 2 (the lower cover 4). The metal wiring board 3b is accommodated in the card housing 2 in the condition that the other surface of the metal plate of the metal wiring board 3b is in close contact with the other surface of the metal block 14. Heat generated from the electronic components 6 is transferred through the metal plate of the metal wiring board 3b and the metal block 14 to the card housing 2 with a high efficiency, thereby improving the radiation efficiency.

Seventh Preferred Embodiment

Figure 10:
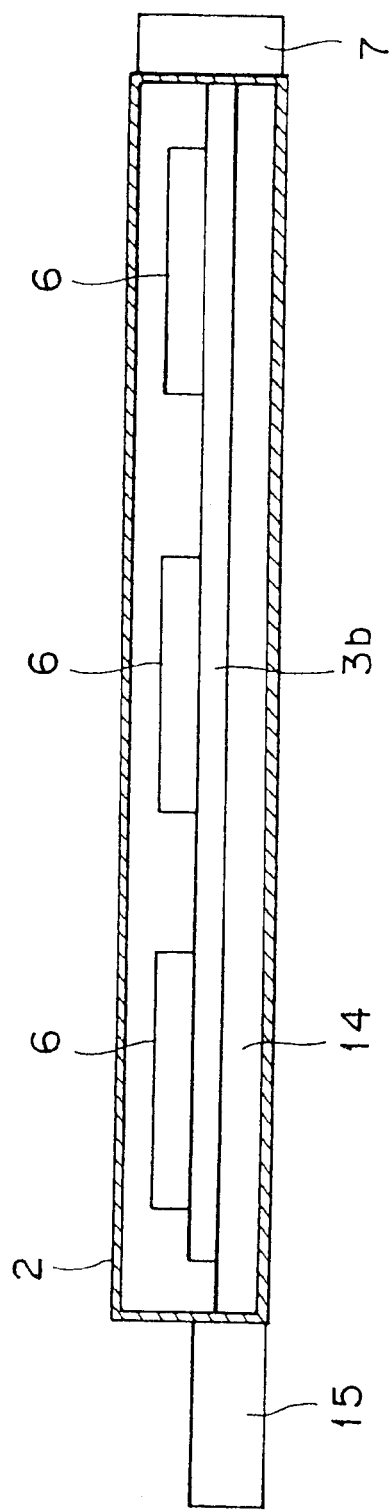
FIG. 10 is a sectional view of an IC card according to a seventh preferred embodiment of the present invention.

FIG. 10 shows an IC card according to a seventh preferred embodiment of the present invention. This preferred embodiment is an improvement of the sixth preferred embodiment, so that only an improved portion will be described. A rear end portion 15 (an end portion opposite to the first connector 7) of a platelike metal block 14 formed of a metal material having a high heat conductivity, such as copper (Cu), is projected rearward from the rear end of the card housing 2 (frame 5) to be exposed to the outside of the card housing 2. Heat generated from the electronic components 6 is transferred through the metal plate of the metal wiring board 3b and the metal block 14 to the card housing 2. Furthermore, the heat is radiated from the exposed rear end portion 15 of the metal block 14 directly to the outside of the card housing 2. Accordingly, the radiation efficiency can be further improved.

Eighth Preferred Embodiment

Figure 11:
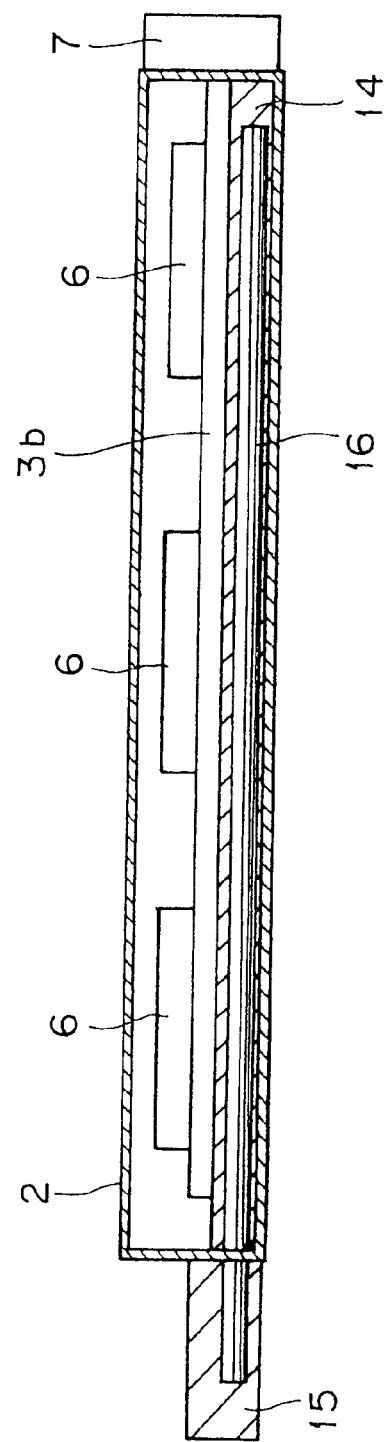
FIG. 11 is a sectional view of an IC card according to an eighth preferred embodiment of the present invention.

FIG. 11 shows an IC card according to an eighth preferred embodiment of the present invention. This preferred embodiment is an improvement of the seventh preferred embodiment, so that only an improved portion will be described. At least one heat pipe 16 is embedded in the metal block 14 so as to extend over the substantially whole length thereof ranging from a portion located inside the card housing 2 to the rear end portion 15 exposed to the outside of the card housing 2. The heat pipe 16 is a heat transfer device for transferring heat from a high-temperature position to a low-temperature position by vaporization and condensation of an operating fluid contained in a sealed metal tube. Heat generated from the electronic components 6 is positively transferred to the exposed rear end portion 15 of the metal block 14 by the operation of the heat pipe 16. Accordingly, the radiation efficiency can be further improved.

Ninth Preferred Embodiment

Figure 12:
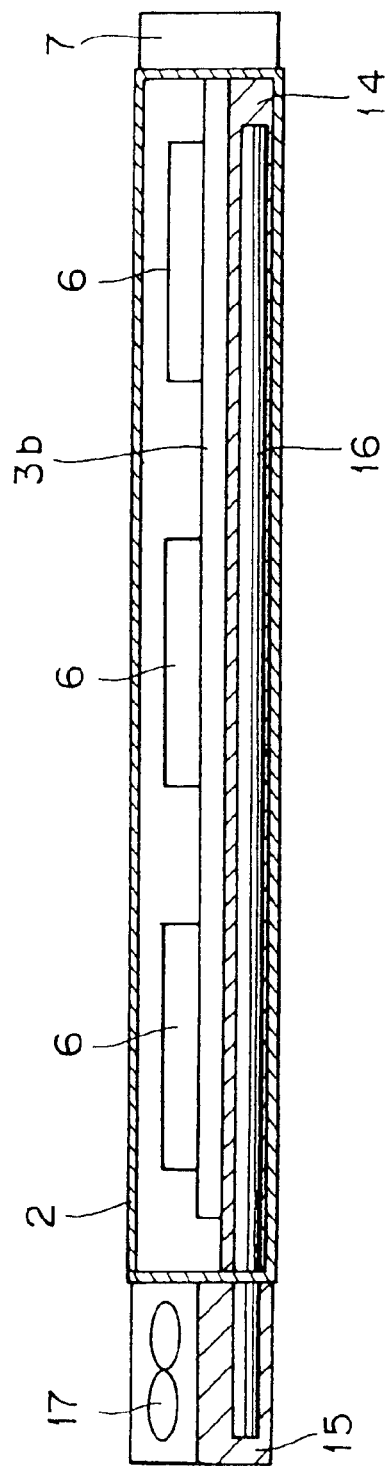
FIG. 12 is a sectional view of an IC card according to a ninth preferred embodiment of the present invention.

FIG. 12 shows an IC card according to a ninth preferred embodiment of the present invention. This preferred embodiment is an improvement of the eighth preferred embodiment, so that only an improved portion will be described. A fan 17 is mounted on the rear end portion 15 of the metal block 14 exposed to the outside of the card housing 2, so as to generate an air flow in the vicinity of the rear end portion 15. Heat generated from the electronic components 6 is positively transferred to the exposed rear end portion 15 of the metal block 14 by the operation of the heat pipe 16. Furthermore, the rear end portion 15 is positively cooled by the fan 17. Accordingly, the radiation efficiency can be further improved.

Tenth Preferred Embodiment

Figure 13:
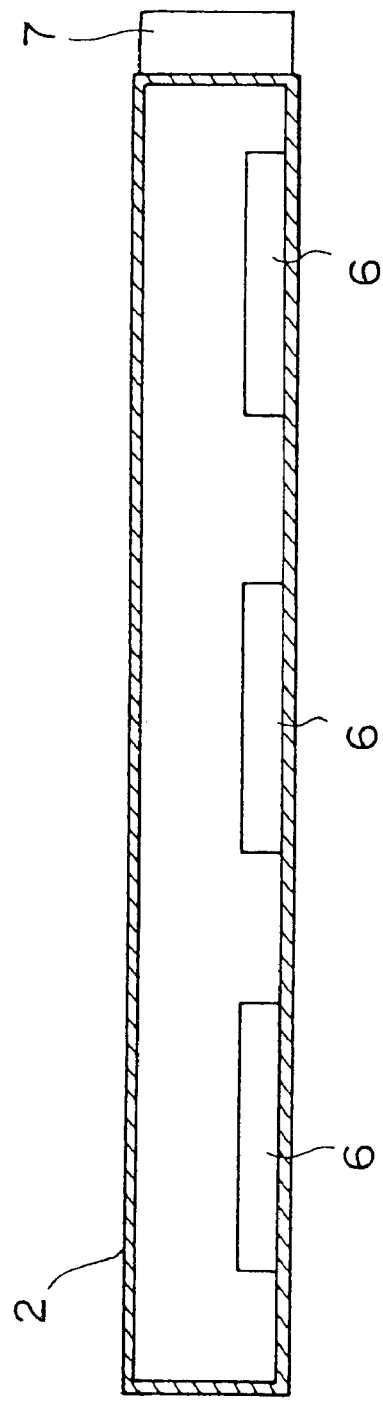
FIG. 13 is a sectional view of an IC card according to a tenth preferred embodiment of the present invention.

FIG. 13 shows an IC card according to a tenth preferred embodiment of the present invention. In the first to ninth preferred embodiments mentioned above, the printed wiring board 3 (the flexible printed wiring board 3b and the metal wiring board 3b) is formed independently of the card housing 2. In contrast, the tenth preferred embodiment is characterized in that a wiring layer is formed on the inner surface of the card housing 2 (the lower cover 4) through an insulating layer, and the electronic components 6 are mounted on the wiring layer of the card housing 2. Thus, the electronic components 6 are mounted on the inner surface of the card housing 2, and the outer surface of the card housing 2 corresponding to the electronic components mounted portion is exposed to the outside, thereby radiating heat from the electronic components 6 with a high efficiency. Alternatively, the card housing 2 (the lower cover 4) may be formed of an insulating material. In this case, the wiring layer may be formed directly on the inner surface of the card housing 2 without the insulating layer.

Eleventh Preferred Embodiment

Figure 14:
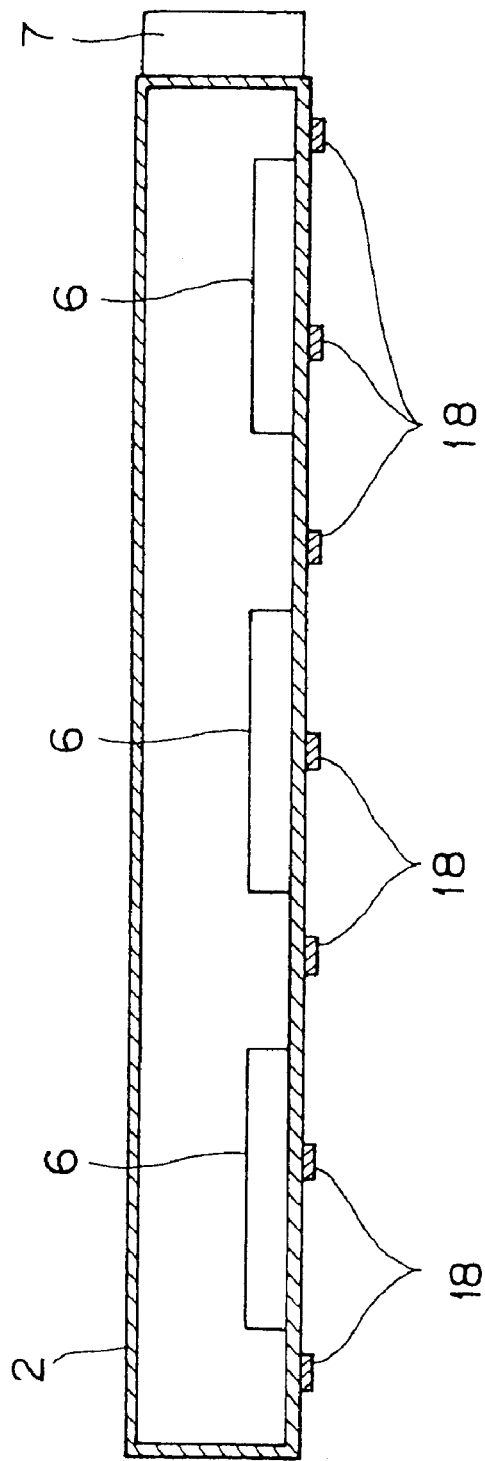
FIG. 14 is a sectional view of an IC card according to an eleventh preferred embodiment of the present invention.

FIG. 14 shows an IC card according to an eleventh preferred embodiment of the present invention. This preferred embodiment is an improvement of the tenth preferred embodiment, so that only an improved portion will be described. A plurality of projecting members 18 are mounted on the outer surface of the card housing 2 (the lower cover 4) opposite to the inner surface thereof on which the electronic components 6 are mounted. Owing to the projecting members 18, the surface area of the card housing 2 can be increased to thereby improve the radiation efficiency over the tenth preferred embodiment.

Twelfth Preferred Embodiment

Figure 15:
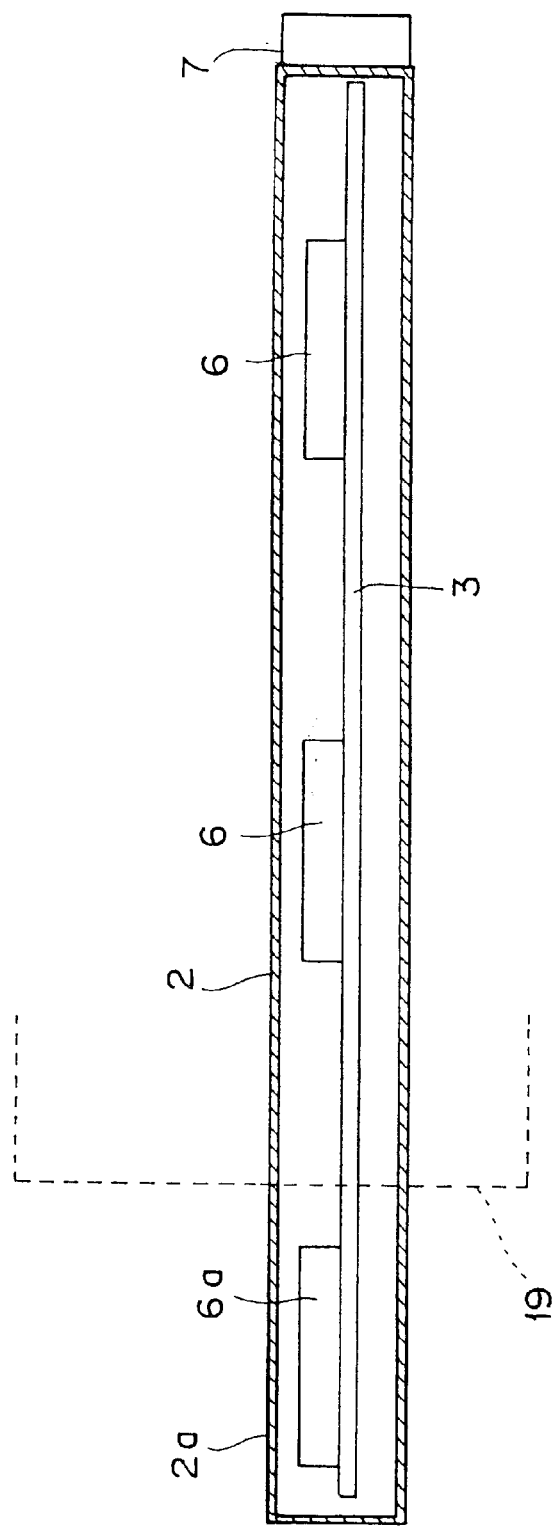
FIG. 15 is a sectional view of an IC card according to a twelfth preferred embodiment of the present invention.

FIG. 15 shows an IC card according to a twelfth preferred embodiment of the present invention. The card housing 2 of the IC card 1 has a specified dimension in a direction of insertion of the IC card 1 into the slot of the IC card mountable device. This dimension is set so that a rear end portion 2a of the card housing 2 projects outward from the slot of the IC card mountable device (from a wall surface 19 of the housing of the IC card mountable device) in the condition that the IC card 1 is inserted in the slot.

The printed wiring board 3 is accommodated in the card housing 2 so as to extend from the inside to the outside of the slot in the condition that the IC card 1 is inserted in the slot. Since the rear end portion 2a of the card housing 2 projects from the slot, this portion 2a is exposed to the outside of the IC card mountable device, thereby enhancing heat radiation from this portion 2a. Furthermore, heating components 6a of the electronic components 6 mounted on the printed wiring board 3 are located on a rear end portion of the printed wiring board 3 outside of the slot (a portion corresponding to the rear end portion 2a of the card housing 2) in the condition that the IC card 1 is inserted in the slot, thereby further improving the radiation efficiency.

Thirteenth Preferred Embodiment

Figure 16:
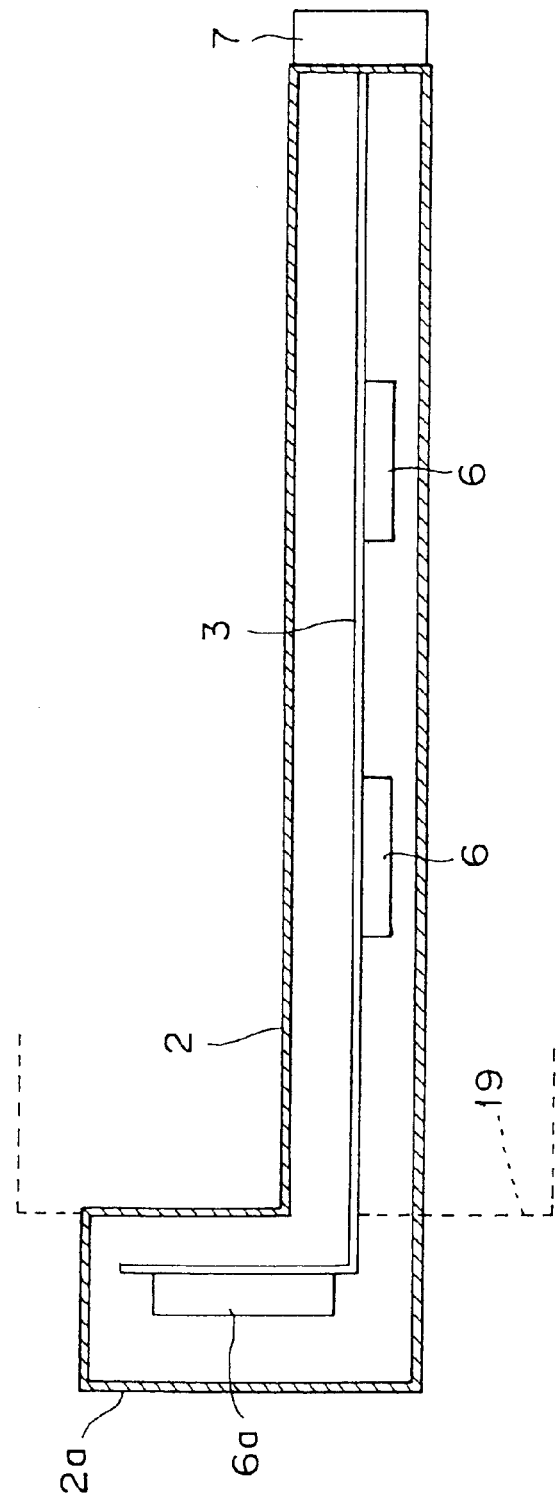
FIG. 16 is a sectional view of an IC card according to a thirteenth preferred embodiment of the present invention.

FIG. 16 shows an IC card according to a thirteenth preferred embodiment of the present invention. This preferred embodiment is an improvement of the twelfth preferred embodiment, so that only an improved portion will be described. The card housing 2 of the IC card 1 is bent so that the rear end portion 2a projecting from the slot (from the wall surface 19 of the housing of the IC card mountable device) in the condition where the IC card 1 is inserted in the slot is substantially perpendicular to the other portion of the card housing 2 present inside the slot. The printed wiring board 3 is also bent so that its rear end portion is substantially perpendicular to the other portion of the printed wiring board 3 present inside the slot. The heating components 6a of the electronic components 6 mounted on the printed wiring board 3 are located on the rear end portion of the printed wiring board 3 outside the slot. Accordingly, the radiation efficiency can be improved. Further, in the condition where the IC card 1 is inserted in the slot, the rear end portion 2a extends along the wall surface 19 of the housing of the IC card mountable device, thereby suppressing possible interference of the exposed rear end portion of the IC card 1.

Fourteenth Preferred Embodiment

Figure 17:
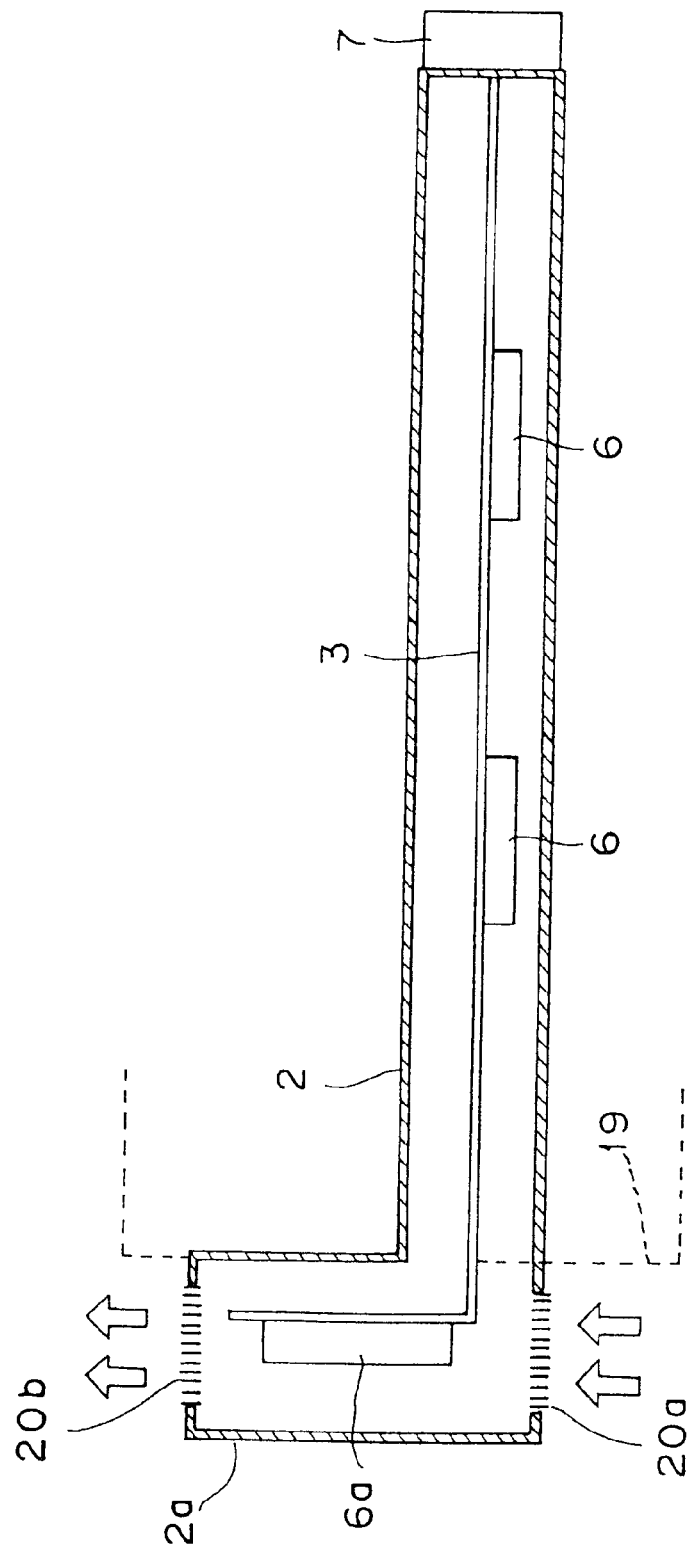
FIG. 17 is a sectional view of an IC card according to a fourteenth preferred embodiment of the present invention.

FIG. 17 shows an IC card according to a fourteenth preferred embodiment of the present invention. This preferred embodiment is an improvement of the thirteenth preferred embodiment, so that only an improved portion will be described. The upper and lower surfaces of the rear end portion 2a of the card housing 2 are respectively formed with a plurality of upper slits 20a and a plurality of lower slits 20b to make communication between the inside and the outside of the card housing 2. The heating components 6a of the electronic components 6 mounted on the printed wiring board 3 are located inside the rear end portion 2a of the card housing 2. The heating components 6a can be cooled by the outside air flowing from the lower slits 20a into the rear end portion 2a, and the upper slits 20b allows the air inside the rear end portion 2a to flow out of the rear end portion 2a, thereby further improving the radiation efficiency.

Fifteenth Preferred Embodiment

Figure 18:
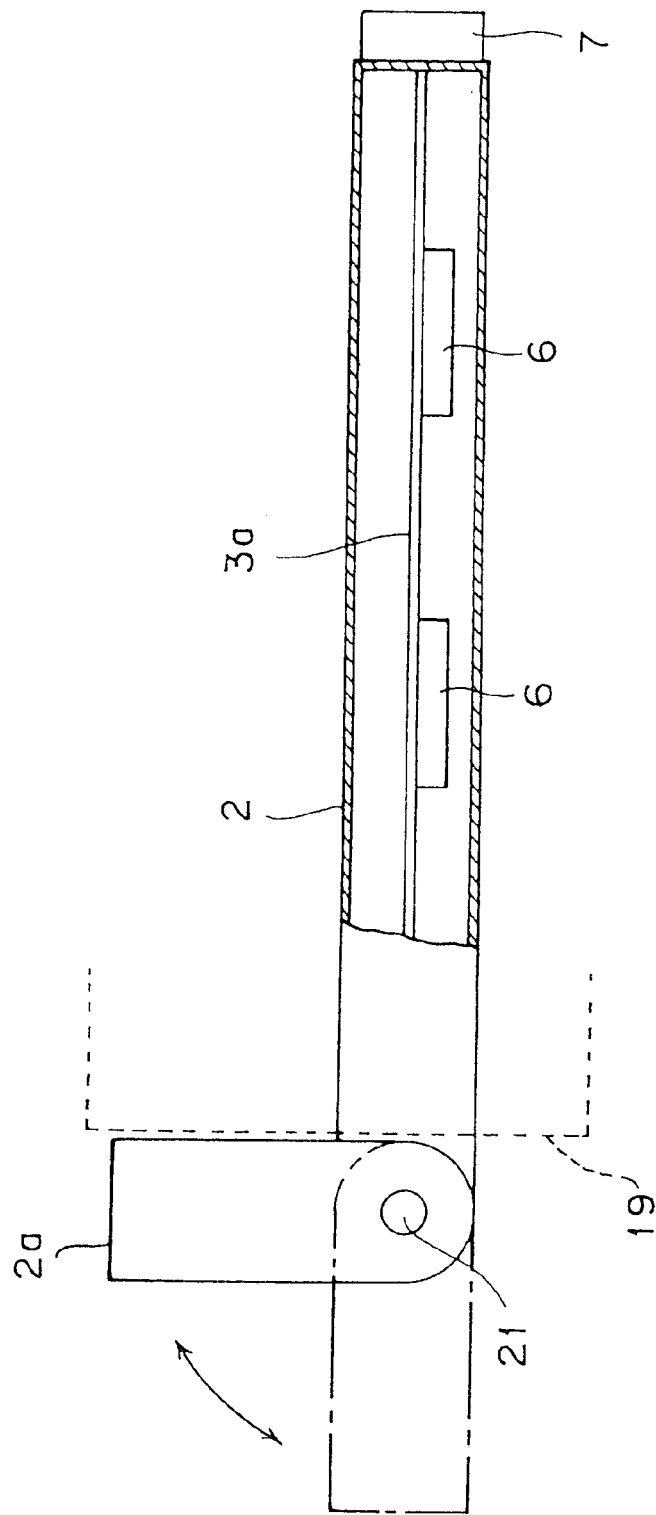
FIG. 18 is a partially cutaway, side view of an IC card according to a fifteenth preferred embodiment of the present invention.

FIG. 18 shows an IC card according to a fifteenth preferred embodiment of the present invention. This preferred embodiment is an improvement of the twelfth preferred embodiment or the thirteenth preferred embodiment, so that only an improved portion will be described. The dimension of the card housing 2 of the IC card 1 in the direction of insertion of the IC card 1 into the slot of the IC card mountable device is set so that the rear end portion 2a of the card housing 2 projects outward from the slot (from the wall surface 19 of the housing of the IC card mountable device) in the condition where the IC card 1 is inserted in the slot. The rear end portion 2a of the card housing 2 is pivotably supported through a shaft 21 to the other portion of the card housing 2 present inside the slot. More specifically, the rear end portion 2a is rotatable about the shaft 21 in the range of about 90 degrees upward (clockwise as viewed in FIG. 18) and/or downward (counterclockwise as viewed in FIG. 18) from a flat condition aligned with the other portion of the card housing 2 present inside the slot. In the condition where the IC card 1 is not inserted in the slot, the rear end portion 2a can be set in the flat condition to allow easy handling without a hitch, whereas in the condition where the IC card 1 is inserted in the slot, the rear end portion 2a can be rotated from the flat condition to the raised or lowered condition where the rear end portion 2a extends along the wall surface 19 of the housing of the IC card mountable device, thereby suppressing possible interference of the exposed rear end portion of the IC card 1. A sheetlike flexible printed wiring board 3a is used as the printed wiring board accommodated in the card housing 2, so as to allow the rotation of the rear end portion 2a of the card housing 2 without a hitch. Although not shown, heating components of the electronic components 6 mounted on the flexible printed wiring board 3a are located at a rear end portion of the flexible printed wiring board 3a corresponding to the rear end portion 2a of the card housing 2.

Sixteenth Preferred Embodiment

Figure 19:
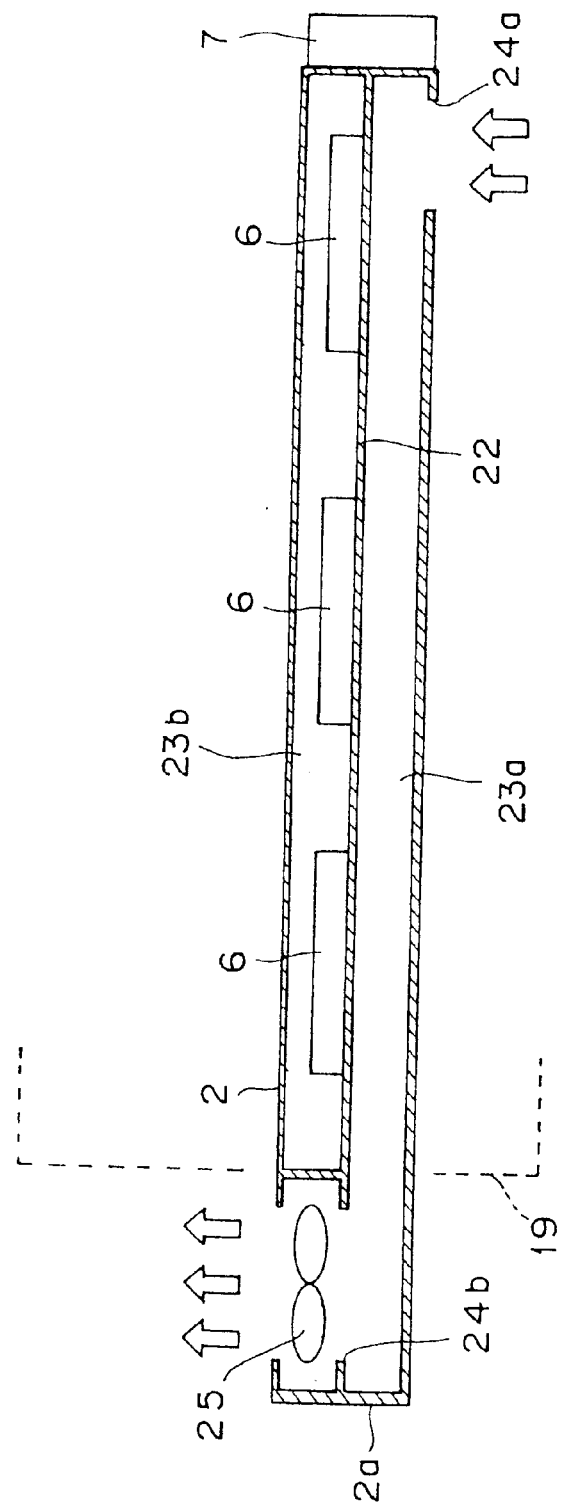
FIG. 19 is a sectional view of an IC card according to a sixteenth preferred embodiment of the present invention.

FIG. 19 shows an IC card according to a sixteenth preferred embodiment of the present invention. The dimension of the card housing 2 of the IC card 1 in the direction of insertion of the IC card 1 into the slot of the IC card mountable device is set so that the rear end portion 2a of the card housing 2 projects outward from the slot (from the wall surface 19 of the housing of the IC card mountable device) in the condition where the IC card 1 is inserted in the slot. The space inside of the card housing 2 is divided into two sections along the thickness thereof (in the vertical direction) by an inside wall 22 to define a first space 23a and a second space 23b. The front end portion of the card housing 2 is formed with a first opening 24a for making communication between the outside space and the first space 23a, and the exposed rear end portion 2a of the card housing 2 is formed with a second opening 24b for making communication between the outside space and the first space 23a. A wiring layer is formed through an insulating layer on the upper surface of the inside wall 22 of the card housing 2 exposed to the second space 23b, and the electronic components 6 are mounted on the wiring layer. A fan 25 is mounted in the vicinity of the second opening 24b of the card housing 2, so as to generate an air flow directing from the first space 23a to the outside space. Accordingly, when the fan 25 is operated in the condition where the IC card 1 is inserted in the slot of the IC card mountable device, the air inside the IC card mountable device is positively introduced from the first opening 24a of the card housing 2 into the first space 23a, thereby cooling the inside wall 22 on which the electronic components 6 are mounted, and then positively discharged from the second opening 24b to the outside of the IC card mountable device. Thus, the inside wall 22 on which the electronic components 6 are mounted can be efficiently cooled. Furthermore, this structure contributes also to cooling of any heating parts present in the IC card mountable device other than the IC card 1.

Seventeenth Preferred Embodiment

Figure 20:
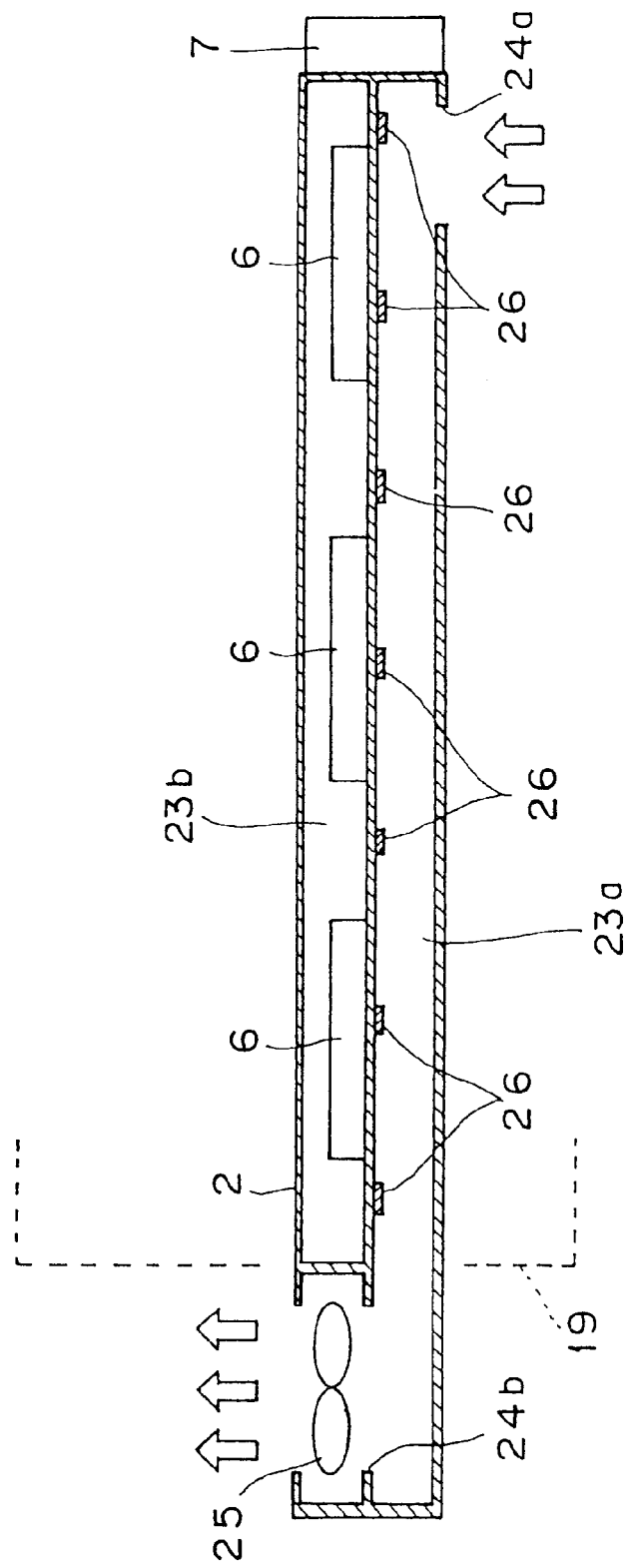
FIG. 20 is a sectional view of an IC card according to a seventeenth preferred embodiment of the present invention.

FIG. 20 shows an IC card according to a seventeenth preferred embodiment of the present invention. This preferred embodiment is an improvement of the sixteenth preferred embodiment, so that only an improved portion will be described. A plurality of projections 26 (and/or recesses) are formed integrally with the lower surface of the inside wall 22 of the card housing 2 exposed to the first space 23a. Accordingly, the surface area of the lower surface of the inner wall 22 exposed to the first space 23a can be made larger than that in the sixteenth preferred embodiment, thereby further improving the efficiency of cooling of the electronic components 6 mounted on the upper surface of the inside wall 22 exposed to the second space 23b.

Eighteenth Preferred Embodiment

Figure 21:
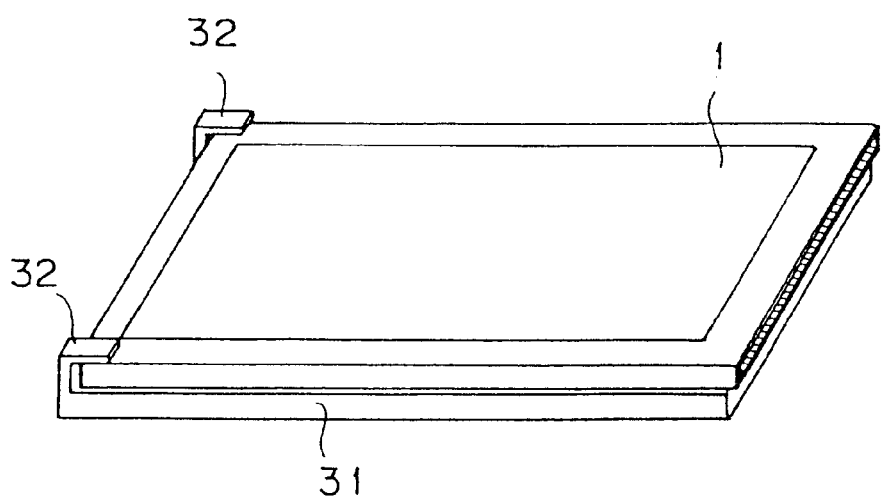
FIG. 21 is a perspective view of an IC card cooling tray according to an eighteenth preferred embodiment of the present invention.

FIG. 21 shows an IC card cooling tray 31 according to an eighteenth preferred embodiment of the present invention. The IC card cooling tray 31 is configured so as to correspond to the IC card 1. That is, the tray 31 is composed of a tray body formed as a substantially rectangular thin-plate on which the IC card 1 is to be mounted and a pair of inverted L-shaped holding members 32 formed integrally with the tray body at its rear corner portions. The IC card 1 is held at its rear corner portions by the pair of holding members 32 in the condition where it is in close contact with the tray body, thus being integrated with the IC card cooling tray 31. The IC card cooling tray 31 holding the IC card 1 is inserted into the slot of the IC card mountable device. The IC card cooling tray 31 is formed of a material having a high heat conductivity, such as copper (Cu). In this manner, the IC card 1 is integrated with the IC card cooling tray 31 in close contact with each other, and the assembly of the IC card 1 and the tray 31 is inserted into the slot. Accordingly, heat from the IC card 1 can be radiated with a high efficiency through the IC card cooling tray 31 having a large heat capacity and a large surface area.

Nineteenth Preferred Embodiment

Figure 22:
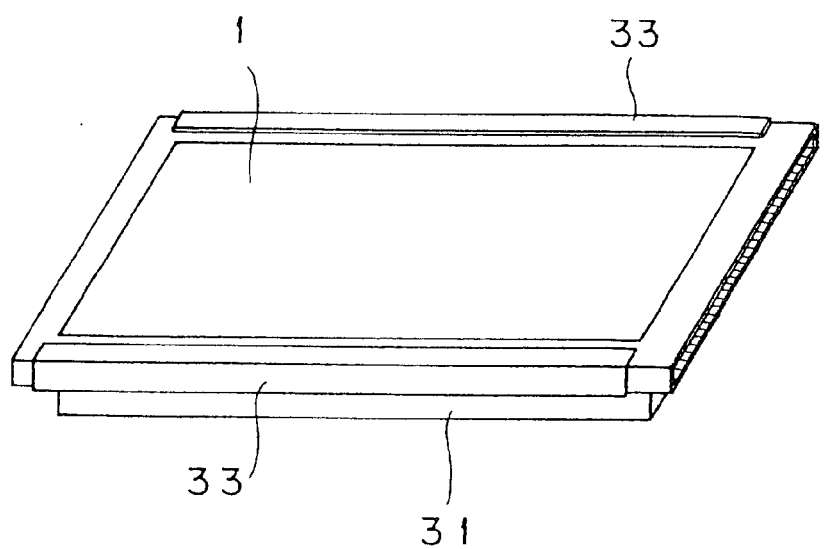
FIG. 22 is a perspective view of an IC card cooling tray according to a nineteenth preferred embodiment of the present invention.

FIG. 22 shows an IC card cooling tray 31 according to a nineteenth preferred embodiment of the present invention. In contrast with the eighteenth preferred embodiment wherein the holding members 32 are formed at the rear corner portions of the tray body of the IC card cooling tray 31, the nineteenth preferred embodiment is characterized in that a pair of guides (holding members) 33 for guiding the opposite side edges of the IC card 1 are formed integrally with the opposite side edges of the tray body of the IC card cooling tray 31. The IC card 1 is held on the tray body in close contact therewith by engaging the IC card 1 with the cooling tray 31 as being guided by the guides 33 of the cooling tray 31. The cooling tray 31 thus holding the IC card 1 is inserted into the slot of the IC card mountable device. The other configuration of this preferred embodiment is similar to that of the eighteenth preferred embodiment, and the description thereof will therefore be omitted herein.

Twentieth Preferred Embodiment

Figure 23:
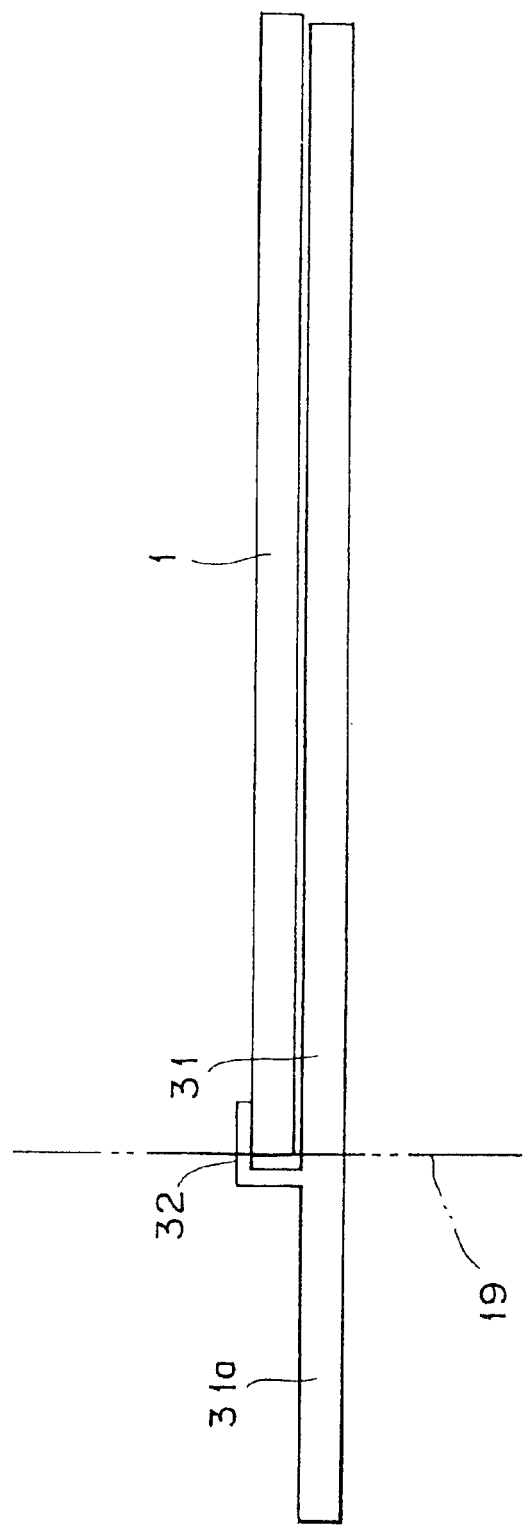
FIG. 23 is a side view of an IC card cooling tray according to a twentieth preferred embodiment of the present invention.

FIG. 23 shows an IC card cooling tray 31 according to a twentieth preferred embodiment of the present invention. This preferred embodiment is an improvement of the eighteenth preferred embodiment, so that only an improved portion will be described. The dimension of the tray body of the IC card cooling tray 31 in the direction of insertion of the cooling tray 31 holding the IC card 1 into the slot of the IC card mountable device is set so that a rear end portion 31*a* of the cooling tray 31 projects outward from the wall surface 19 of the housing of the IC card mountable device. The two inverted L-shaped holding members 32 are formed on the upper surface of the tray body at the opposite side positions just outside of the wall surface 19 in the condition where the cooling tray 31 is inserted in the slot. The rear end portion of the IC card 1 is held by the holding members 32 in the condition where the IC card 1 is in close contact with the tray body, thus integrating the IC card 1 and the cooling tray 31. The cooling tray 31 holding the IC card 1 is inserted into the slot of the IC card mountable device. The cooling tray 31 is formed of a material having a high heat conductivity, such as copper (Cu). According to this preferred embodiment, the rear end portion 31*a* of the cooling tray 31 is exposed to the outside of the IC card mountable device, thereby radiating heat from the IC card 1 through the rear end portion 31*a* with a high efficiency.

Twenty-first Preferred Embodiment

Figure 24:
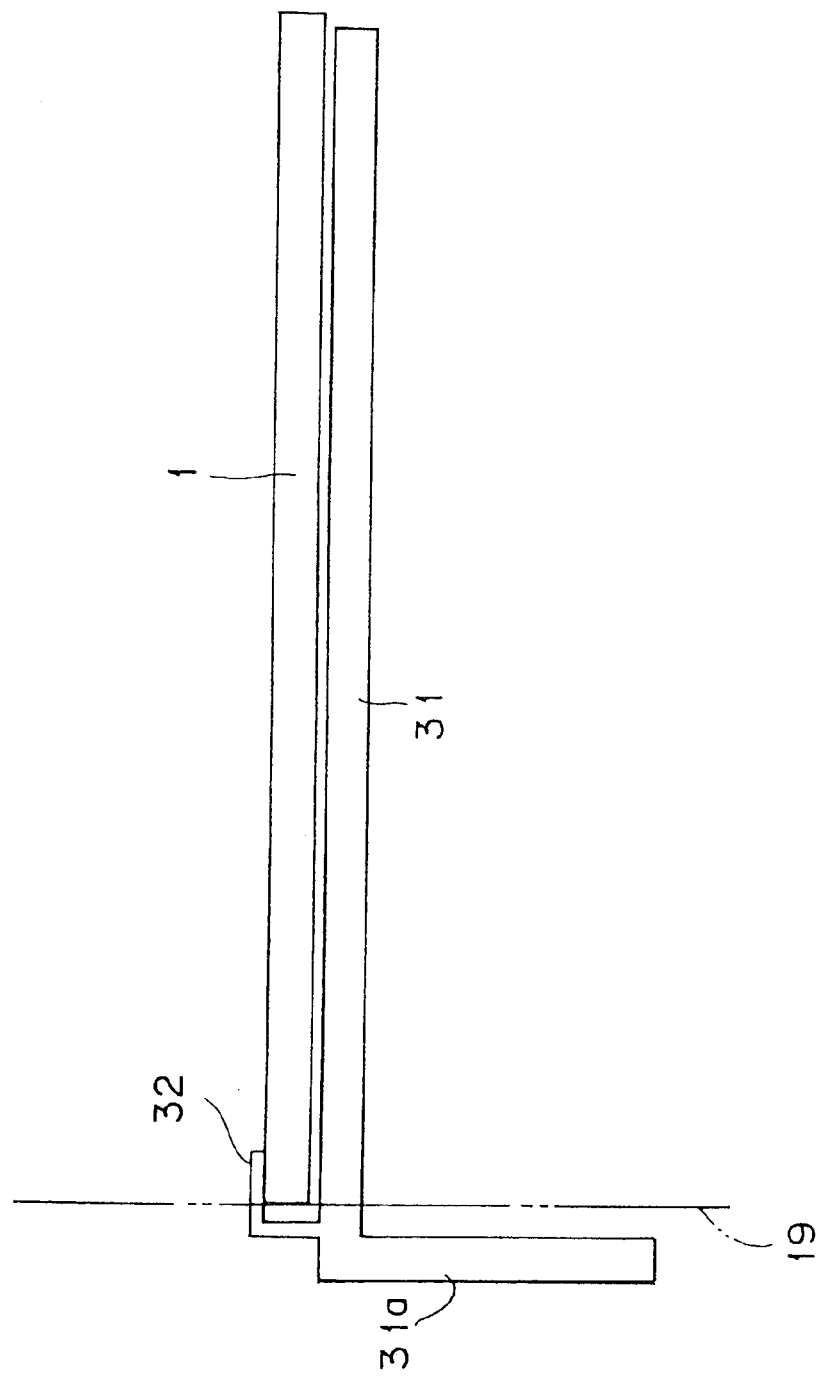
FIG. 24 is a side view of an IC card cooling tray according to a twenty-first preferred embodiment of the present invention.

FIG. 24 shows an IC card cooling tray 31 according to a twenty-first preferred embodiment of the present invention. This preferred embodiment is an improvement of the twentieth preferred embodiment, so that only an improved portion will be described. The tray body of the IC card cooling tray 31 is bent so that the rear end portion 31*a* of the cooling tray 31 is substantially perpendicular to the other portion of the cooling tray 31 present inside the slot. The rear end portion 31*a* of the cooling tray 31 is exposed to the outside of the IC card mountable device, thereby radiating heat from the IC card 1 through the rear end portion 31*a* with a high efficiency. Furthermore, in the condition where the cooling tray 31 is inserted in the slot, the rear end portion 31*a* extends along the wall surface 19 of the housing of the IC card mountable device, thereby suppressing possible interference of the rear end portion 31*a* of the cooling tray 31.

Twenty-second Preferred Embodiment

Figure 25:
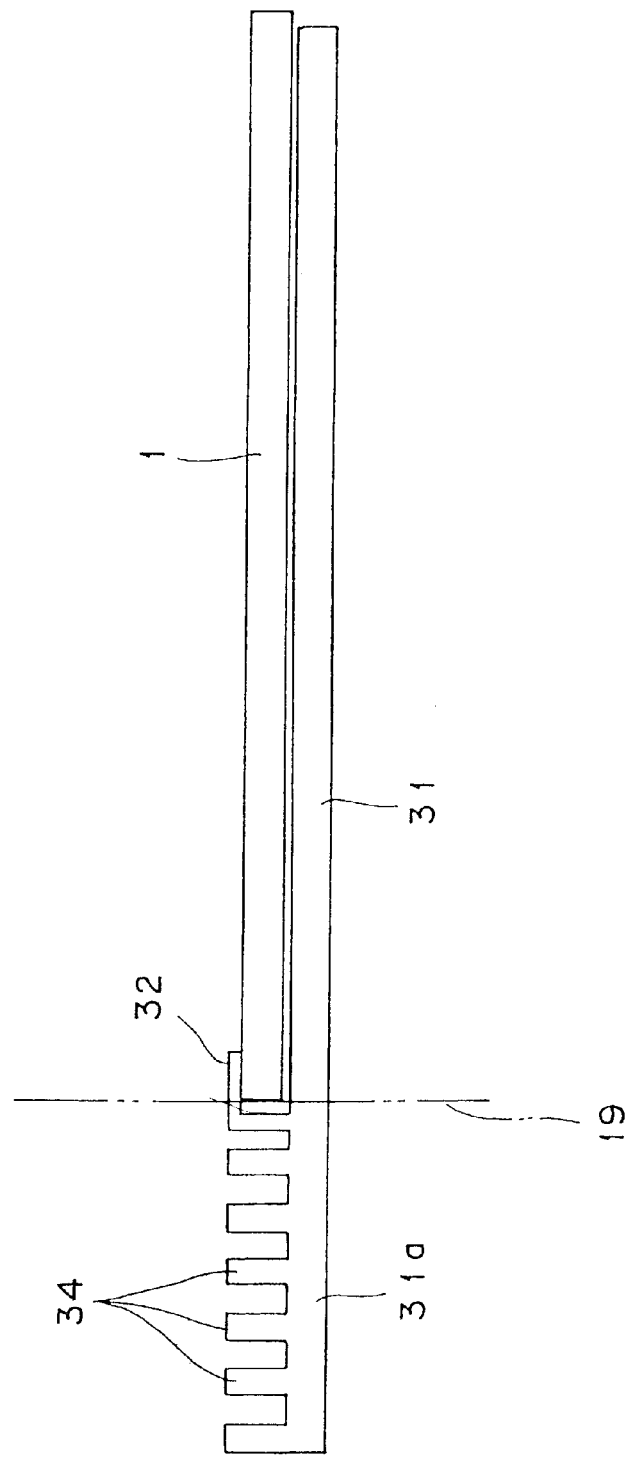
FIG. 25 is a side view of an IC card cooling tray according to a twenty-second preferred embodiment of the present invention.

FIG. 25 shows an IC card cooling tray 31 according to a twenty-second preferred embodiment of the present invention. This preferred embodiment is an improvement of the twentieth preferred embodiment, so that only an improved portion will be described. The upper surface of the exposed rear end portion 31*a* of the IC card cooling tray 31 is formed with a plurality of projections 34 (or recesses). Owing to the projections 34, the surface area of the exposed rear end portion 31*a* of the cooling tray 31 can be increased to thereby further improve the radiation efficiency over the twentieth preferred embodiment.

Twenty-third Preferred Embodiment

Figure 26:
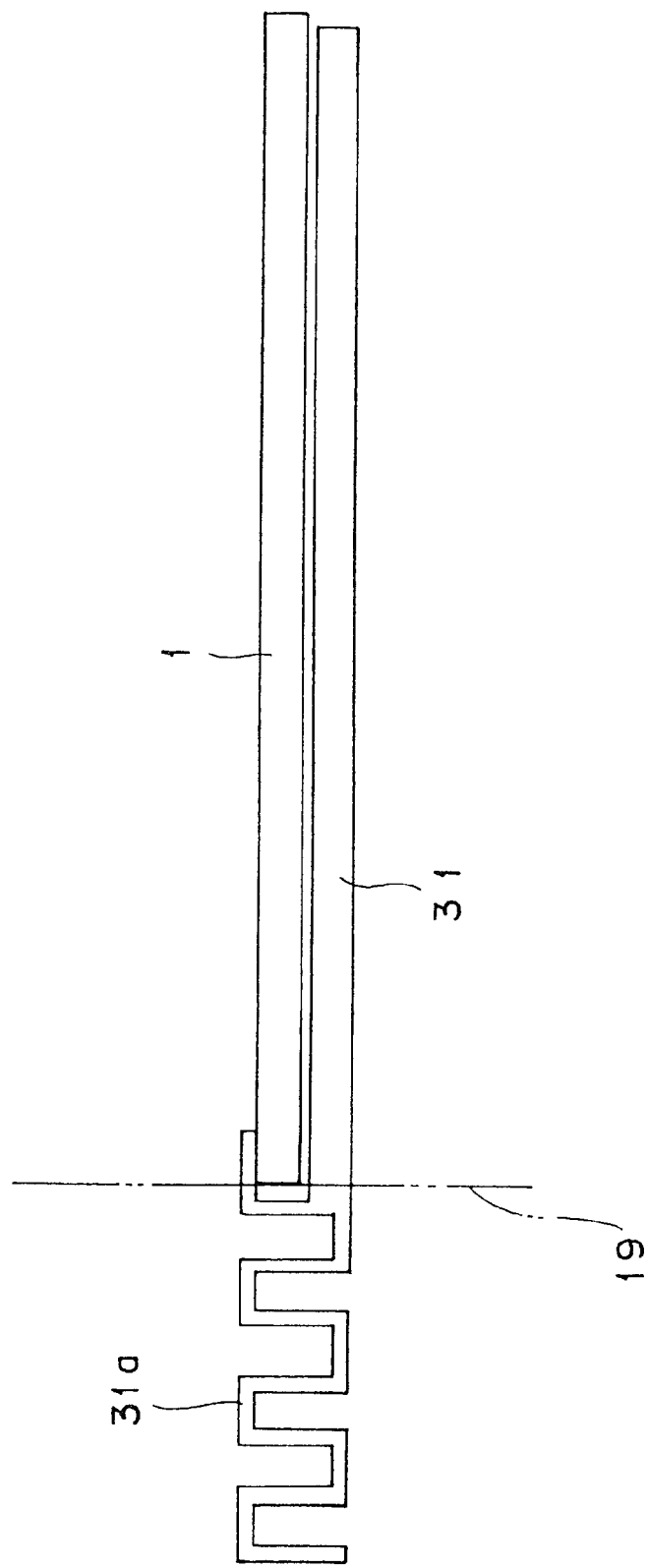
FIG. 26 is a side view of an IC card cooling tray according to a twenty-third preferred embodiment of the present invention.

FIG. 26 shows an IC card cooling tray 31 according to a twenty-third preferred embodiment of the present invention. This preferred embodiment is an improvement of the twentieth preferred embodiment, so that only an improved portion will be described. The rear end portion 31*a* of the IC card cooling tray 31 is corrugated to form a plurality of alternate ridges and grooves. With this configuration, the surface area of the exposed rear end portion 31*a* of the cooling tray 31 can be increased to thereby further improve the radiation efficiency over the twentieth preferred embodiment.

Twenty-fourth Preferred Embodiment

Figure 27:
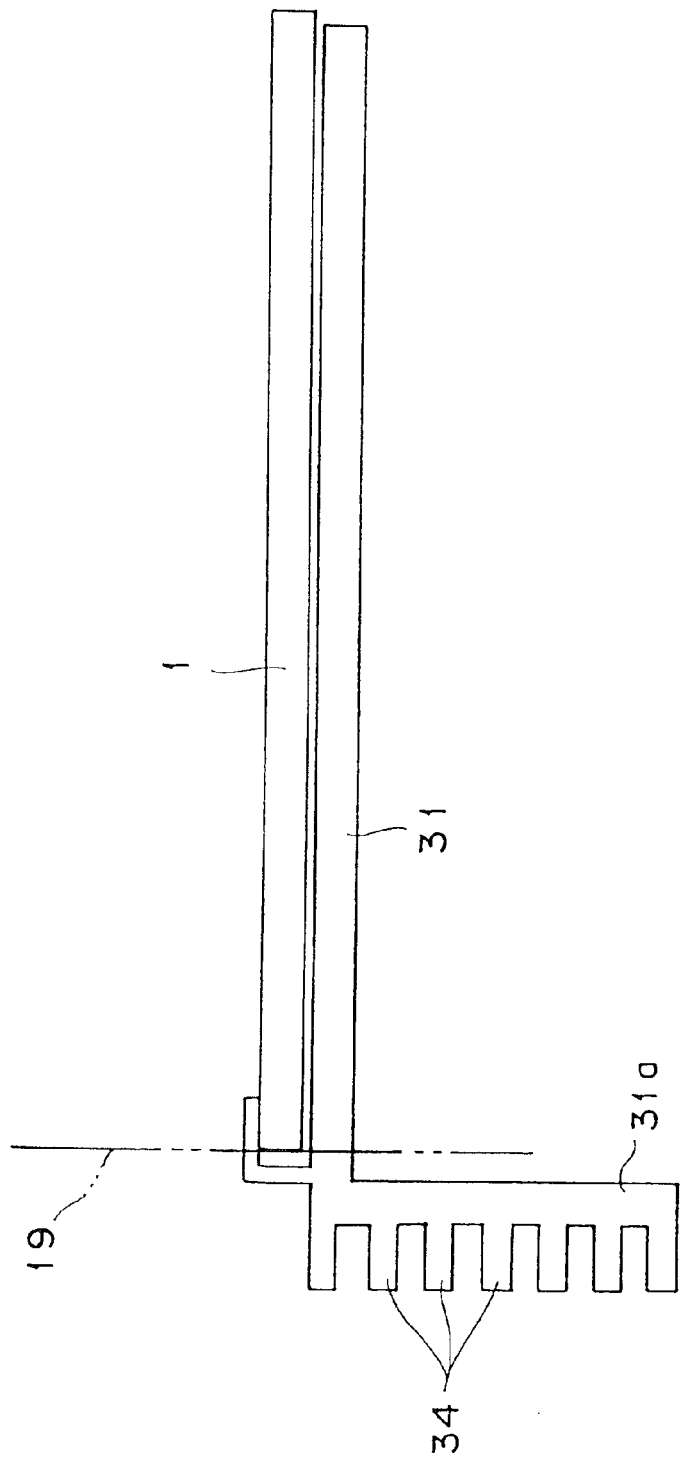
FIG. 27 is a side view of an IC card cooling tray according to a twenty-fourth preferred embodiment of the present invention.

FIG. 27 shows an IC card cooling tray 31 according to a twenty-fourth preferred embodiment of the present invention. This preferred embodiment is an improvement of the twenty-first preferred embodiment, so that only an improved portion will be described. The rear end portion 31*a* of the IC card cooling tray 31 is exposed to the outside of the IC card mountable device, and extends in substantially perpendicular relationship to the other portion present inside the slot. One surface of the exposed rear end portion 31*a* is formed with a plurality of projections 34 (or recesses). Owing to the projections 34, the surface area of the exposed rear end portion 31*a* of the cooling tray 31 can be increased to thereby further improve the radiation efficiency over the twenty-first preferred embodiment.

Twenty-fifth Preferred Embodiment

Figure 28:
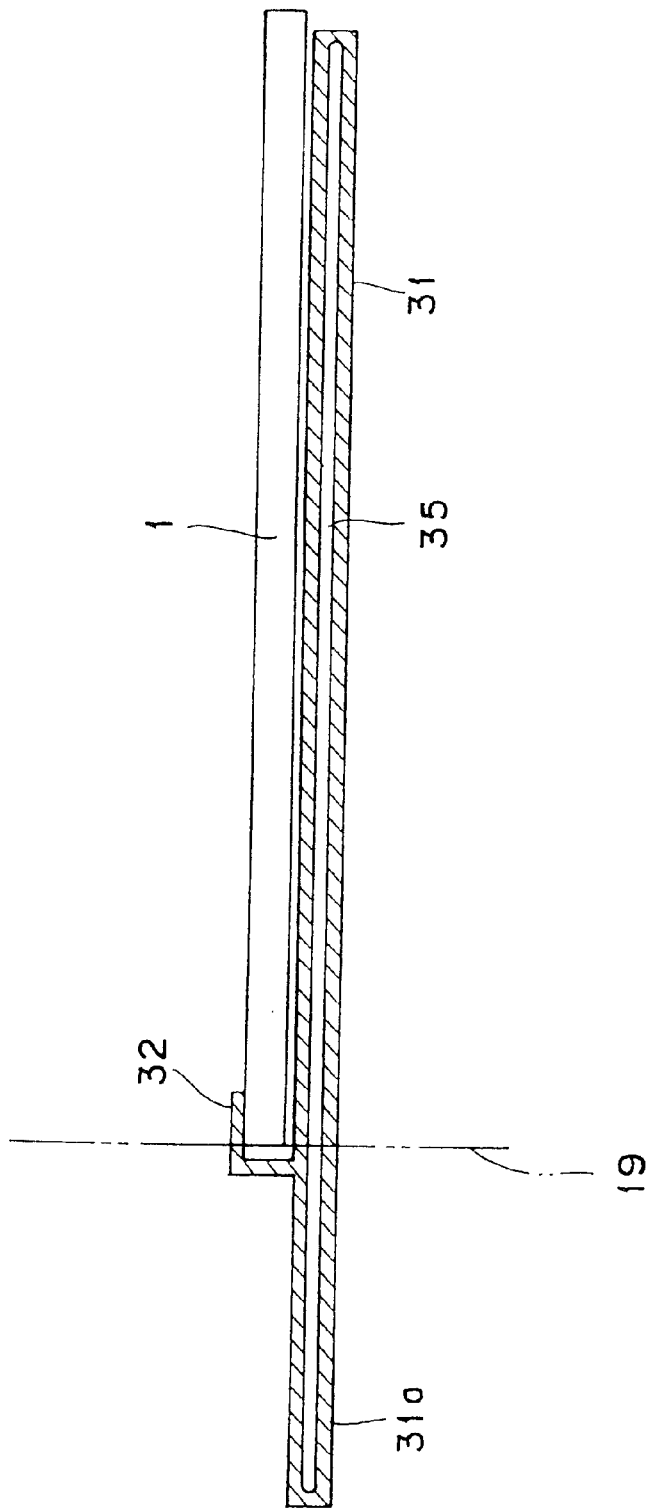
FIG. 28 is a sectional view of an IC card cooling tray according to a twenty-fifth preferred embodiment of the present invention.

FIG. 28 shows an IC card cooling tray 31 according to a twenty-fifth preferred embodiment of the present invention. This preferred embodiment is an improvement of the twentieth preferred embodiment, so that only an improved portion will be described. At least one heat pipe 35 is embedded in the tray body of the IC card cooling tray 31 so as to extend over the substantially whole length thereof. Accordingly, in the condition where the cooling tray 31 holding the IC card 1 is inserted in the slot, the heat pipe 35 extends in the range from a portion of the tray body located inside the slot to the rear end portion 31*a* exposed to the outside of the slot. The heat pipe 35 is a heat transfer device for transferring heat from a high-temperature position to a low-temperature position by vaporization and condensation of an operating fluid contained in a sealed metal tube. Heat transferred from the IC card 1 to the cooling tray 31 is positively transferred to the exposed rear end portion 31*a* by the heat pipe 35. Accordingly, the efficiency of cooling of the IC card 1 can be further improved over the twentieth preferred embodiment.

Twenty-sixth Preferred Embodiment

Figure 29:
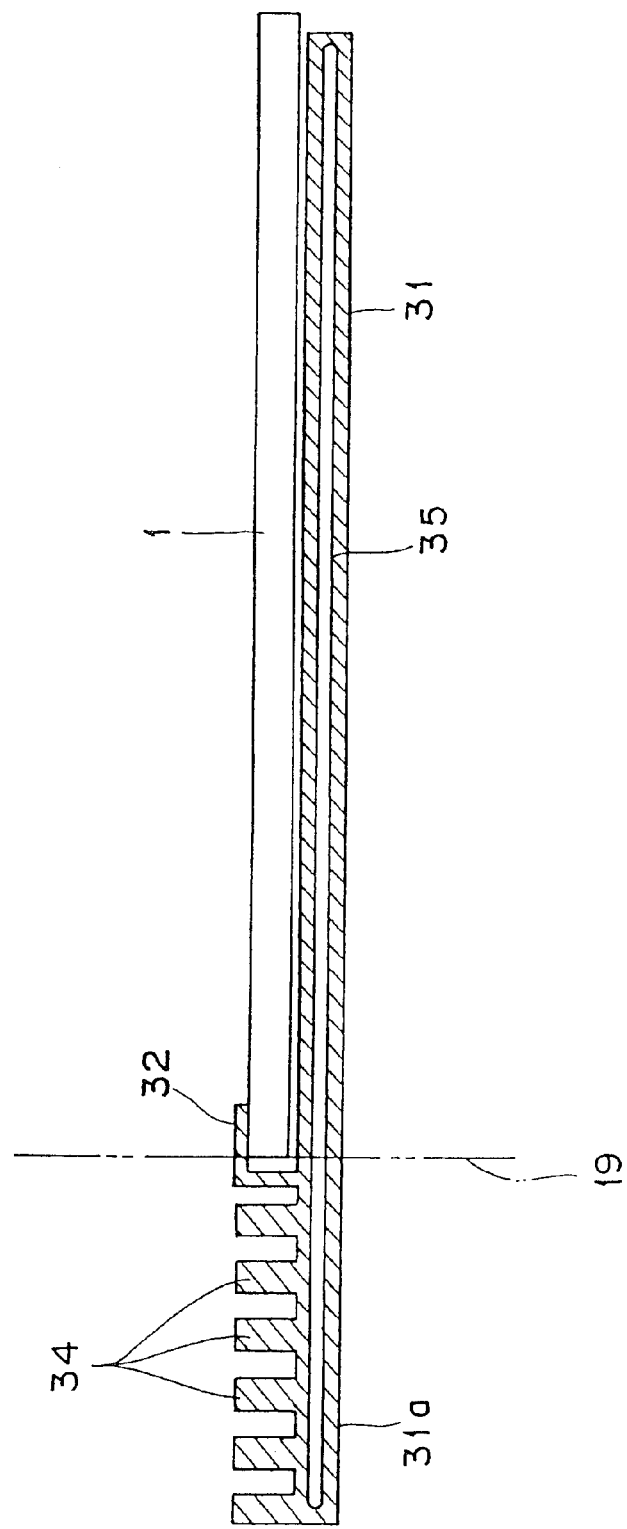
FIG. 29 is a sectional view of an IC card cooling tray according to a twenty-sixth preferred embodiment of the present invention.

FIG. 29 shows an IC card cooling tray 31 according to a twenty-sixth preferred embodiment of the present invention. This preferred embodiment is an improvement of the twenty-second preferred embodiment, so that only an improved portion will be described. At least one heat pipe 35 is embedded in the tray body of the IC card cooling tray 31 so as to extend over the substantially whole length thereof. Accordingly, in the condition where the cooling tray 31 holding the IC card 1 is inserted in the slot, the heat pipe 35 extends in the range from a portion of the tray body located inside the slot to the rear end portion 31a exposed to the outside of the slot. The heat pipe 35 is a heat transfer device for transferring heat from a high-temperature position to a low-temperature position by vaporization and condensation of an operating fluid contained in a sealed metal tube. Heat transferred from the IC card 1 to the cooling tray 31 is positively transferred to the exposed rear end portion 31a by the heat pipe 35. Accordingly, the efficiency of cooling of the IC card 1 can be further improved over the twenty-second preferred embodiment.

Twenty-seventh Preferred Embodiment

Figure 30:
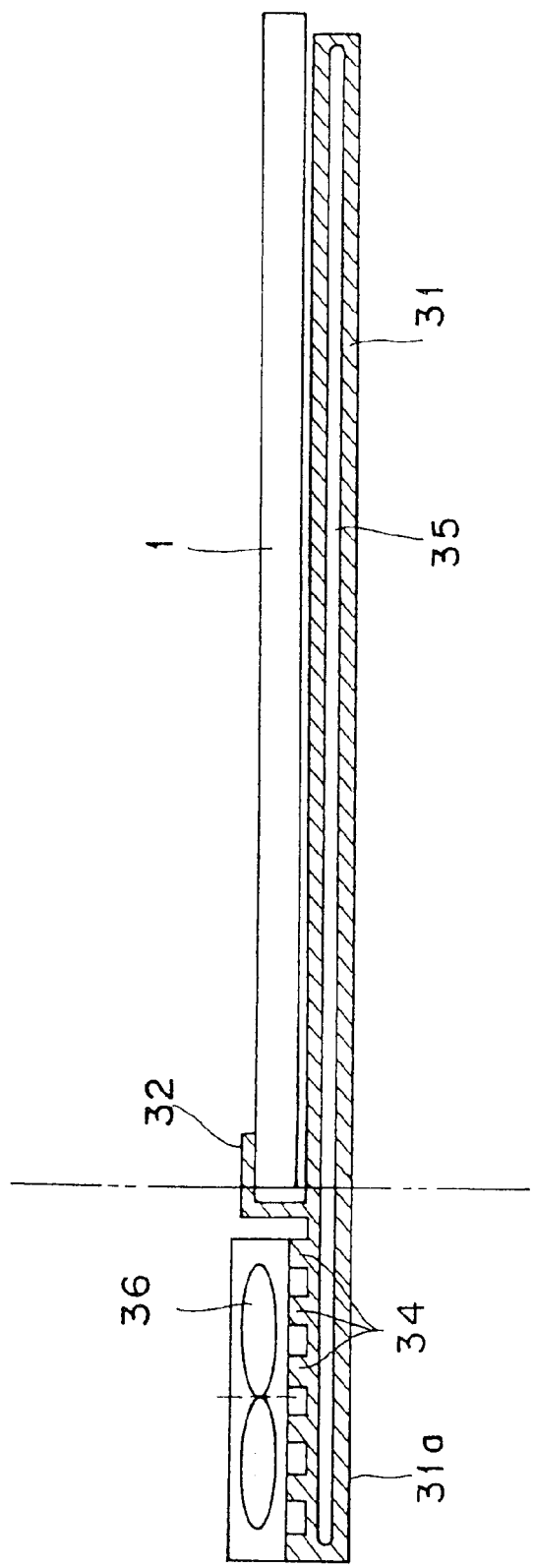
FIG. 30 is a sectional view of an IC card cooling tray according to a twenty-seventh preferred embodiment of the present invention.

FIG. 30 shows an IC card cooling tray 31 according to a twenty-seventh preferred embodiment of the present invention. This preferred embodiment is an improvement of the twenty-sixth preferred embodiment, so that only an improved portion will be described. A fan (axial-flow fan) 36 is mounted on the upper ends of the projections 34 of the rear end portion 31a of the IC card cooling tray 31, so as to generate an air flow over the rear end portion 31a. Accordingly, the projections 34 and their surroundings can be positively cooled by the air flow generated by the fan 36, thereby further improving the efficiency of cooling of the IC card 1 over the twenty-sixth preferred embodiment.

Twenty-eighth Preferred Embodiment

Figure 31:
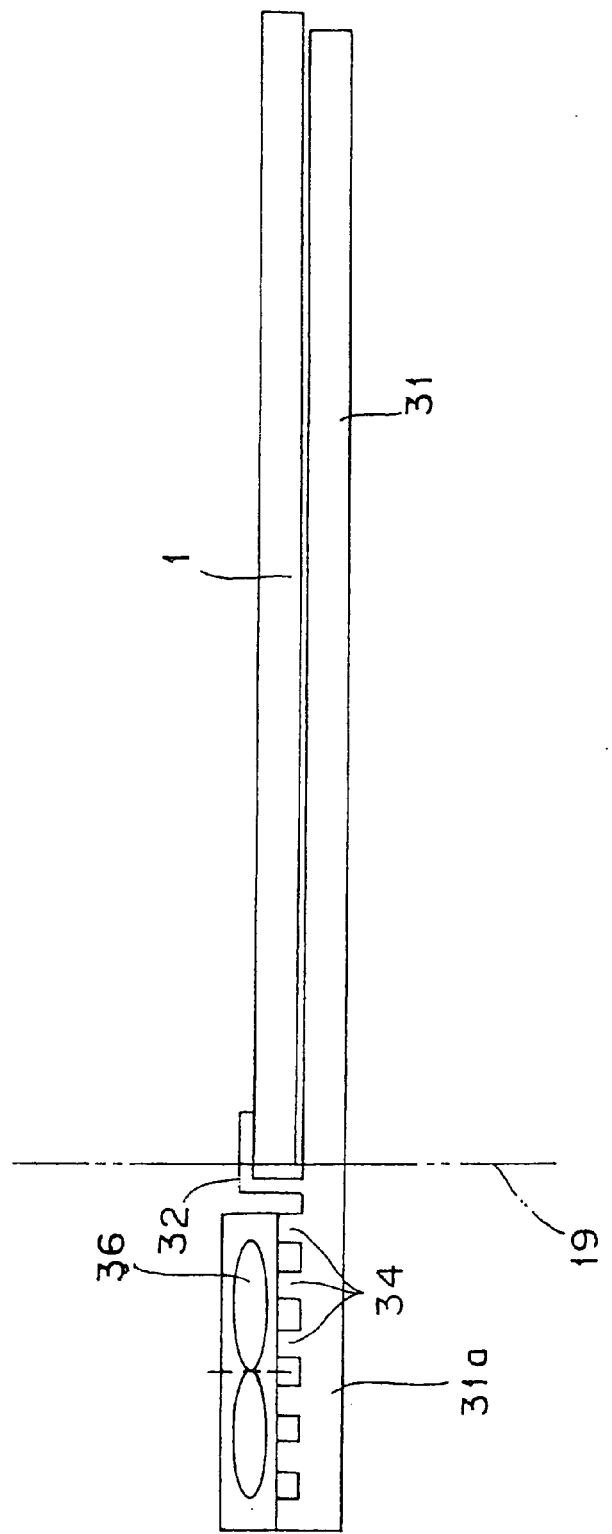
FIG. 31 is a side view of an IC card cooling tray according to a twenty-eighth preferred embodiment of the present invention.

FIG. 31 shows an IC card cooling tray 31 according to a twenty-eighth preferred embodiment of the present invention. This preferred embodiment is an improvement of the twenty-second preferred embodiment, so that only an improved portion will be described. A fan (axial-flow fan) 36 is mounted on the upper ends of the projections 34 of the rear end portion 31a of the IC card cooling tray 31, so as to generate an air flow over the rear end portion 31a. Accordingly, the projections 34 and their surroundings can be positively cooled by the air flow generated by the fan 36, thereby further improving the efficiency of cooling of the IC card 1 over the twenty-second preferred embodiment.

Twenty-ninth Preferred Embodiment

Figure 32:
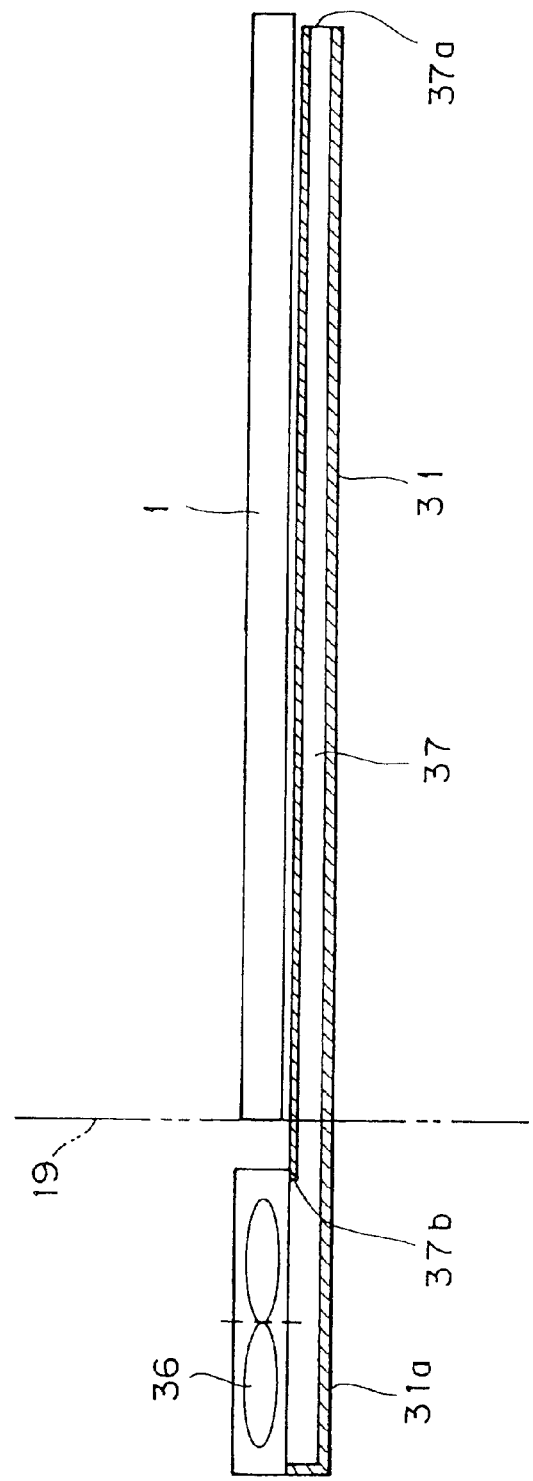
FIG. 32 is a sectional view of an IC card cooling tray according to a twenty-ninth preferred embodiment of the present invention.

FIG. 32 shows an IC card cooling tray 31 according to a twenty-ninth preferred embodiment of the present invention. Cooling tray 31 is an insertable device which is illustrated as being fully inserted into a slot 40 in wall surface 19 of the housing of the IC card mountable device. FIG. 32 illustrates the body of the IC card cooling tray 31 divided into a first part 42 which is removably inserted into a slot 40 and a second part 44 positioned out of slot 40. Slot 40 is a PCMCIA slot. An inside space 37 is defined in the body of the IC card cooling tray 31 so as to extend over the substantially whole length thereof ranging from the front end to the rear end. The front end of the body of the cooling tray 31 is formed with a first opening 37a for making communication between the inside space 37 and an inside of the IC card mountable device. The upper surface of the rear end portion 31a of the cooling tray 31 is formed with a second opening 37b for making communication between the inside space 37 and the outside space. A fan (axial-flow fan) 36 is mounted on the periphery of the second opening 37b of the rear end portion 31a, so as to generate an air flow directing from the inside space 37 to the outside space such that inside space 37 defines an air flowpath. When the fan 36 is operated in the condition where the cooling tray 31 holds IC card 1 and is inserted in the slot 40 of the IC card mountable device, the air inside the IC card mountable device is introduced from the first opening 37a into the inside space 37 to cool a portion of the body. As shown, IC card 1 is in close contact with the body of cooling tray 31. Then, the introduced air is positively discharged from the second opening 37b to the outside of the IC card mountable device. Accordingly, the IC card 1 can be efficiently cooled. Further, this structure contributes also to cooling of any heating parts mounted in the IC card mountable device other than the IC card 1.

Thirtieth Preferred Embodiment

Figure 33:
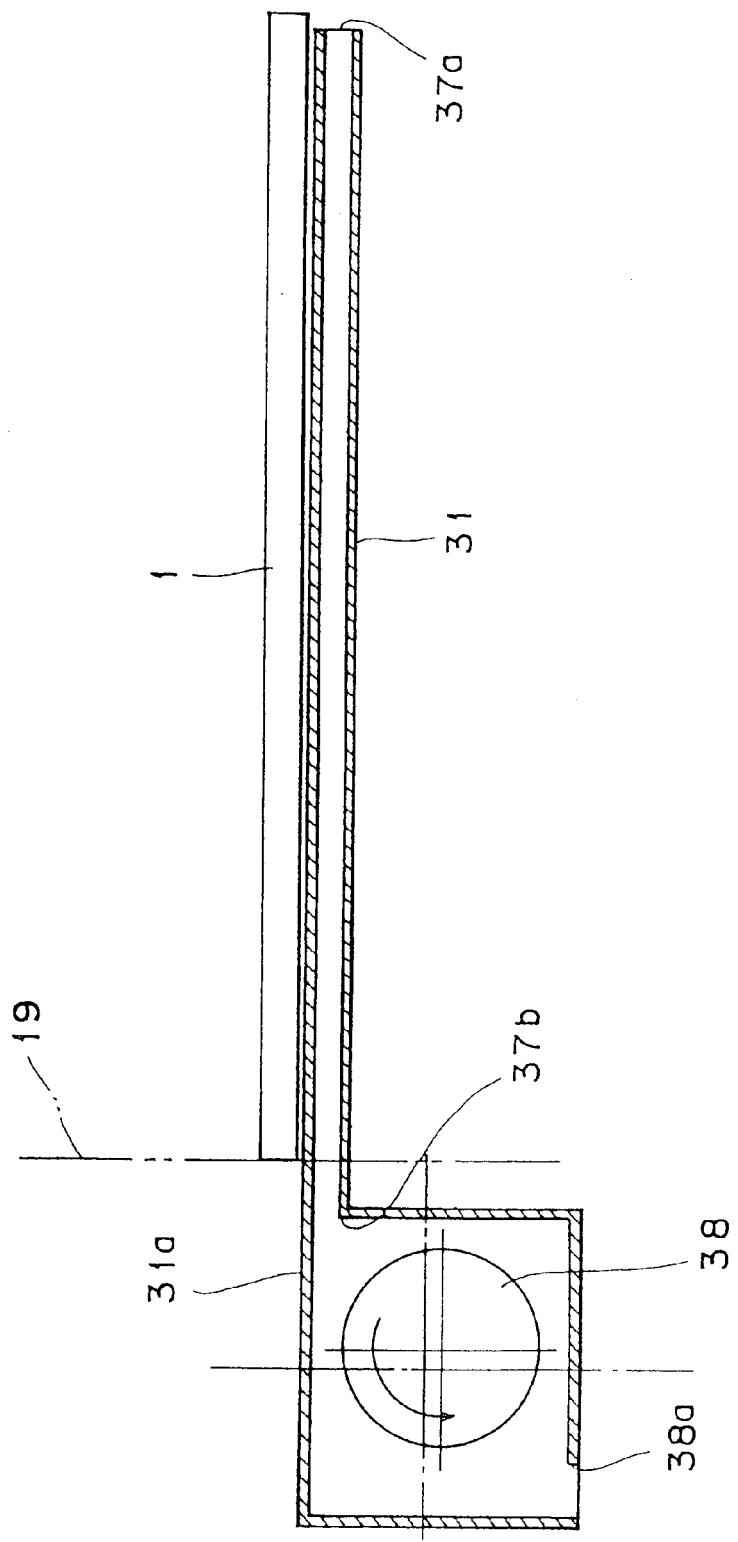
FIG. 33 is a sectional view of an IC card cooling tray according to a thirtieth preferred embodiment of the present invention.

FIG. 33 shows an IC card cooling tray 31 according to a thirtieth preferred embodiment of the present invention. This preferred embodiment is an improvement of the twenty-ninth preferred embodiment, so that only an improved portion will be described. In contrast with the twenty-ninth preferred embodiment employing the axial-flow fan 36, the thirtieth preferred embodiment employs a cross-flow fan 38. Further, in contrast with the twenty-ninth preferred embodiment wherein the fan 36 is mounted so as to discharge the inside air to the upper side of the rear end portion 31a of the cooling tray 31, the fan 38 in the thirtieth preferred embodiment is mounted so as to discharge the inside air to the lower side of the rear end portion 31a of the cooling tray 31. Reference numeral 38a denotes an air discharge opening for discharging the inside air by the operation of the fan 38.

Thirty-first Preferred Embodiment

Figure 34:
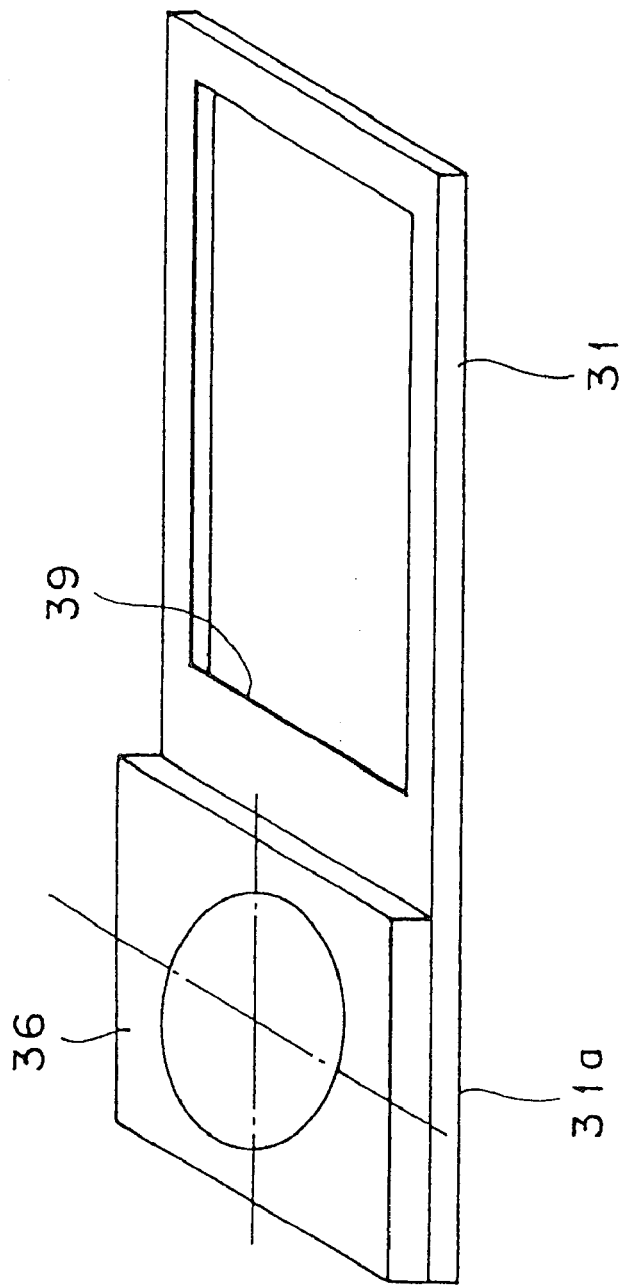
FIG. 34 is a perspective view of an IC card cooling tray according to a thirty-first preferred embodiment of the present invention.

FIG. 34 shows an IC card cooling tray 31 according to a thirty-first preferred embodiment of the present invention. This preferred embodiment is an improvement of the twenty-ninth preferred embodiment, so that only an improved portion will be described. Instead of the first opening 37a of the IC card cooling tray 31 in the twenty-ninth preferred embodiment, an upper opening 39 is formed through the upper wall of the tray body of the cooling tray 31 with which the IC card 1 is in close contact, so as to communicate with the inside space 37. The upper opening 39 is closed by the IC card 1 mounted on the upper wall of the tray body of the cooling tray 31. Further, a lower opening is formed through the lower wall of the tray body of the cooling tray 31 opposite to the upper wall thereof, so as to communicate with the inside space 37. According to this preferred embodiment, the lower surface of the IC card 1 exposed through the upper opening 39 to the inside space 37 of the cooling tray 31 can be directly cooled by the air flow generated by the fan 36, thereby further improving the efficiency of cooling of the IC card 1.

Thirty-second Preferred Embodiment

Figure 35:
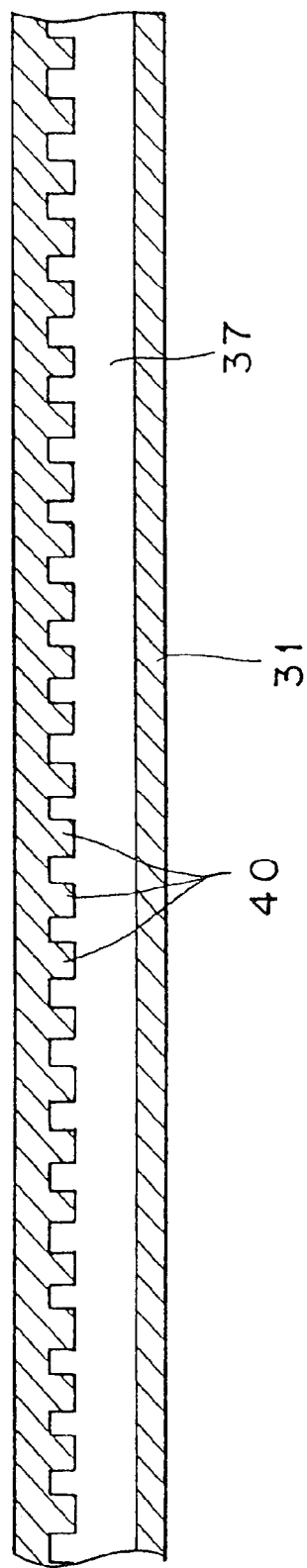
FIG. 35 is an enlarged sectional view of an essential part of an IC card cooling tray according to a thirty-second preferred embodiment of the present invention.

FIG. 35 shows an IC card cooling tray 31 according to a thirty-second preferred embodiment of the present invention. This preferred embodiment is an improvement of the twenty-ninth preferred embodiment, so that only an improved portion will be described. A plurality of projections 40 (or recesses) are formed on the lower surface of the upper wall of the IC card cooling tray 31 with which the IC card 1 is in close contact. That is, the projections 40 are exposed to the inside space 37 defined in the tray body of the cooling tray 31. Owing to the projections 40, the surface area of the lower surface of the upper wall of the cooling tray 31 can be increased, thereby further improving the efficiency of cooling of the IC card 1 kept in close contact with the upper surface of the upper wall of the cooling tray 31.

What is claimed is:

1. A card cooling tray removably insertable into a slot of a card mountable device in a condition where a card is held on said cooling tray, comprising:
- a tray body formed of a substantially rectangular thin plate so that said card is kept in close contact with said tray body, a dimension of said tray body in a direction of insertion of said cooling tray into said slot being set so that said tray body has a first portion present inside said slot and a second portion projecting outward from said slot when said cooling tray is fully inserted in said slot, said second portion of said tray body being formed with a plurality of projections and recesses;
- a holding member formed integrally with said tray body, for removably holding said card; and
- a fan mounted on said plurality of projections and recesses of said second portion of said tray body for generating an air flow in the vicinity of said second portion.

2. A card cooling tray removably insertable into a card mountable device to cool an IC card, said cooling tray comprising:
- a tray body;
- a first portion removably connectable into a card mountable device;
- a second portion having projections and a fan mounted on upper ends of said projections such that air flows between said fan and said projections, said second portion projecting outward of the mountable device when connected thereto; and
- a holding member mounted on said tray body to hold a card in close contact with said tray body.

3. The card cooling tray according to claim 2, wherein said holding member has an L-shape.

* * * * *